US008900976B2

(12) United States Patent
Jin et al.

(10) Patent No.: US 8,900,976 B2
(45) Date of Patent: Dec. 2, 2014

(54) ORGANIC LAYER DEPOSITION APPARATUS, ORGANIC LIGHT-EMITTING DISPLAY APPARATUS, AND METHOD OF MANUFACTURING THE ORGANIC LIGHT-EMITTING DISPLAY APPARATUS

(71) Applicant: Samsung Display Co., Ltd., Yongin, Gyeonggi-Do (KR)

(72) Inventors: Yong-Hyun Jin, Yongin (KR); Jae-Ha Lim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/797,836

(22) Filed: Mar. 12, 2013

(65) Prior Publication Data

US 2014/0084263 A1    Mar. 27, 2014

(30) Foreign Application Priority Data

Sep. 21, 2012   (KR) .................. 10-2012-0105248

(51) Int. Cl.
| | |
|---|---|
| *H01L 21/335* | (2006.01) |
| *H01L 21/677* | (2006.01) |
| *C23C 14/04* | (2006.01) |
| *C23C 14/50* | (2006.01) |
| *C23C 14/56* | (2006.01) |
| *H01L 27/32* | (2006.01) |
| *C23C 14/24* | (2006.01) |
| *H01L 21/67* | (2006.01) |
| *H01L 51/00* | (2006.01) |

(52) U.S. Cl.
CPC ...... *H01L 21/67011* (2013.01); *H01L 21/6776* (2013.01); *H01L 21/67709* (2013.01); *C23C 14/042* (2013.01); *C23C 14/50* (2013.01); *C23C 14/568* (2013.01); *H01L 27/3258* (2013.01); *H01L 27/3244* (2013.01); *C23C 14/24* (2013.01); *H01L 51/0011* (2013.01)
USPC .......................................... 438/478; 117/103

(58) Field of Classification Search
CPC ............ H01L 51/56; B05C 5/02; B05C 11/02
USPC ............ 257/40, 59; 438/478, 34; 117/88, 103
See application file for complete search history.

(56) References Cited

U.S. PATENT DOCUMENTS

| 8,192,546 B2 * | 6/2012 | Kim et al. ..................... 118/721 |
|---|---|---|
| 2004/0237895 A1 * | 12/2004 | Carpenter et al. ............ 118/715 |

(Continued)

FOREIGN PATENT DOCUMENTS

| JP | 2002-175878 | 6/2002 |
|---|---|---|
| JP | 2003-157973 | 5/2003 |

(Continued)

*Primary Examiner* — Nathan Ha
(74) *Attorney, Agent, or Firm* — Christie, Parker & Hale, LLP

(57) ABSTRACT

An organic layer deposition apparatus includes a transfer unit; a first conveyer unit including a guide member having accommodation grooves, a first accommodation part, a second accommodation part, and a connection part that connects the first accommodation part to the second accommodation part; a second conveyer unit for moving the transfer unit without the substrate; a loading unit for fixing the substrate on the transfer unit; a deposition unit including a chamber and an organic layer deposition assembly; and an unloading unit for separating the substrate, wherein the first accommodation part of the guide member is located close to ground compared to the second accommodation part, and includes a lower member, an upper member, elastic members located between the lower and upper members. The substrate fixed on the transfer unit is spaced from the organic layer deposition assembly while being transferred by the first conveyer unit.

5 Claims, 14 Drawing Sheets

(56) References Cited

U.S. PATENT DOCUMENTS

| | | | |
|---|---|---|---|
| 2006/0150910 A1* | 7/2006 | Han et al. | 118/721 |
| 2008/0115729 A1 | 5/2008 | Oda et al. | |
| 2010/0239746 A1* | 9/2010 | Yamazaki et al. | 427/66 |
| 2010/0316791 A1* | 12/2010 | Lin | 427/69 |
| 2011/0052795 A1* | 3/2011 | Choi et al. | 427/69 |
| 2012/0326157 A1* | 12/2012 | Park et al. | 257/72 |
| 2013/0009177 A1 | 1/2013 | Chang et al. | |
| 2013/0217158 A1* | 8/2013 | Lee | 438/22 |
| 2013/0267055 A1* | 10/2013 | Ro et al. | 438/46 |

FOREIGN PATENT DOCUMENTS

| | | |
|---|---|---|
| JP | 2003-297562 | 10/2003 |
| KR | 10-2013-0004830 | 1/2013 |

\* cited by examiner

ORGANIC LAYER DEPOSITION APPARATUS, ORGANIC LIGHT-EMITTING DISPLAY APPARATUS, AND METHOD OF MANUFACTURING THE ORGANIC LIGHT-EMITTING DISPLAY APPARATUS

CROSS-REFERENCE TO RELATED APPLICATION(S)

This application claims priority to and the benefit of Korean Patent Application No. 10-2012-0105248, filed on Sep. 21, 2012, in the Korean Intellectual Property Office, the disclosure of which is incorporated herein in its entirety by reference.

BACKGROUND

1. Field

The present invention relates to an organic layer deposition apparatus, an organic light-emitting display apparatus, and a method of manufacturing the organic light-emitting display apparatus.

2. Description of the Related Art

Recently, relatively bulky display apparatuses are increasingly being replaced with portable thin flat panel display apparatuses. Among the flat panel display apparatuses, organic light-emitting display apparatuses are self-emissive display devices having wide viewing angles and an excellent contrast ratio, and high response speeds, and thus, are regarded as next-generation display apparatuses.

An organic light-emitting display apparatus includes an intermediate layer, a first electrode, a second electrode, and various thin layers. The intermediate layer includes an organic emission layer (EML), and when a voltage is applied to the first and second electrodes, visible rays are generated by the organic EML.

In order to form the intermediate layer and the various thin layers included in the organic light-emitting display apparatus, a deposition process may be used. In this regard, a deposition mask is generally used to form a specific pattern on a substrate via the deposition process.

However, it is difficult to form a fine and minute pattern in the deposition process using the deposition mask. In particular, as a size of the organic light-emitting display apparatus increases, it is difficult to perform an alignment of the substrate and the deposition mask, which makes it difficult to control a characteristic of a deposited layer, e.g., a minute pattern of the deposited layer.

In particular, because it is difficult to control movement of the substrate in a deposition apparatus, it is difficult to control the deposition process. As a result, a characteristic of the deposition process deteriorates, to thus limit the improvement of the characteristic of the deposited layer.

SUMMARY

Embodiments according to the present invention provide an organic layer deposition apparatus that improves a characteristic of a deposited layer, an organic light-emitting display apparatus, and a method of manufacturing the organic light-emitting display apparatus.

In an embodiment according to the present invention, an organic layer deposition apparatus is provided. The organic layer deposition apparatus includes: a transfer unit configured to attach a substrate thereto and to move along with the substrate, the transfer unit including a carrier; a first conveyer unit including a guide member having accommodation grooves to accommodate both sides of the transfer unit so as to guide a first direction movement of the transfer unit to which the substrate is attached, the guide member having a first accommodation part, a second accommodation part, and a connection part that connects the first accommodation part to the second accommodation part; a second conveyer unit for moving the transfer unit from which the substrate is separated, in a direction opposite to the first direction, after deposition has been completed; a loading unit for attaching the substrate to the transfer unit; a deposition unit including a chamber configured to be maintained in a vacuum state and an organic layer deposition assembly for depositing an organic layer on the substrate attached to the transfer unit transferred from the loading unit; and an unloading unit for separating, from the transfer unit, the substrate on which the deposition has been completed while passing through the deposition unit, wherein the first accommodation part of the guide member is located closer to ground than the second accommodation part, and includes a lower member, an upper member, and elastic members located between the lower member and the upper member, wherein the transfer unit is configured to move between the first conveyer unit and the second conveyer unit, and wherein the substrate attached to the transfer unit is configured to be spaced from the organic layer deposition assembly while being transferred by the first conveyer unit.

The upper member and the lower member may include electromagnets.

The upper member may be configured to support the carrier when the elastic members expand.

The organic layer deposition apparatus may further include a magnetically suspended bearing to suspend the transfer unit from the accommodation grooves so as to move the transfer unit in non-contact with the accommodation grooves.

The elastic members may be configured to expand when the magnetically suspended bearing has an operational error, so that the upper member supports the carrier.

The magnetically suspended bearing may include side magnetically suspended bearings corresponding to both side surfaces of the carrier and upper magnetically suspended bearings arranged above the carrier.

The first conveyer unit may further include a gap sensor for measuring a distance between the guide member and the carrier.

The transfer unit may include an electrostatic chuck attached to the carrier and configured to attach the substrate thereto.

A magnetic rail may be at a surface of the carrier, each of the first conveyer unit and the second conveyer unit may include a plurality of coils, and the magnetic rail and the plurality of coils may be configured to generate a driving force to move the transfer unit.

The plurality of coils may be in an atmosphere (ATM) box.

A cam follower may be located at both side surfaces of the carrier, and the second conveyer unit may include a roller guide to support the cam follower, wherein the cam follower of the carrier may be configured to be moved along the roller guide.

The carrier may include a contactless power supply (CPS) module, and a charging track may be at the second conveyer unit to correspond to the CPS module, whereby, when the carrier is transferred in the second conveyer unit, a magnetic field is formed between the charging track and the CPS module so as to supply power to the CPS module in a non-contact manner.

The organic layer deposition assembly may include: a deposition source for discharging a deposition material; a deposition source nozzle unit at a side of the deposition source and including a plurality of deposition source nozzles; and a patterning slit sheet facing the deposition source nozzle unit and including a plurality of patterning slits arranged along a direction, wherein the deposition material that is discharged from the deposition source may pass through the patterning slit sheet to be deposited on the substrate in a pattern.

The patterning slit sheet of the organic layer deposition assembly may be smaller than the substrate in at least one of the first direction or a second direction perpendicular to the first direction.

The organic layer deposition apparatus may include a plurality of organic layer deposition assemblies, and respective deposition sources of the plurality of organic layer deposition assemblies may include different deposition materials.

While the substrate is being moved relative to the organic layer deposition apparatus, respective said deposition materials of the organic layer deposition assemblies may be sequentially deposited on the substrate.

The organic layer deposition apparatus may be configured such that the organic layer deposition apparatus and the substrate are moved relative to each other along a surface parallel to a surface of the substrate on which the deposition material is deposited.

The chamber may further include an upper housing for accommodating the first conveyer unit and the organic layer deposition assembly and a lower housing for accommodating the second conveyer unit.

The deposition source and a deposition source nozzle may be in the upper housing, and wherein a first stage for transferring the patterning slit sheet in the first direction and a second direction perpendicular to the first direction, a second stage for transferring the patterning slit sheet in a third direction perpendicular to each of the first and second directions, and the patterning slit sheet, may be sequentially located over the deposition source and the deposition source nozzle.

The first stage and the second stage may be configured to align patterning slit sheet and the substrate with each other by a movement of the first stage and the second stage.

The organic layer deposition apparatus may further include a shielding member between the deposition source and the patterning slit sheet, wherein the shielding member may be configured to move along with the substrate so as to screen at least a portion of the substrate.

The shielding member may be configured to screen a non-film-forming region of the substrate.

The patterning slit sheet may include a first alignment mark, the substrate may include a second alignment mark, and the deposition unit may further include a camera configured to photograph the first alignment mark and the second alignment mark to detect a relative position of the substrate to the patterning slit sheet.

The deposition unit may further include a sensor for measuring a distance between the substrate and the patterning slit sheet, wherein the sensor may be on the substrate and may be configured to sense a surface of the substrate and a surface of the patterning slit sheet so as to measure a distance between the substrate and the patterning slit sheet.

In another embodiment according to the present invention, a method of manufacturing an organic light-emitting display apparatus by using an organic layer deposition apparatus is provided. The method includes: attaching a substrate to a transfer unit in a loading unit; transporting the transfer unit into a chamber by using a first conveyer unit including a guide member having accommodation grooves to accommodate both sides of the transfer unit so as to guide a first direction movement of the transfer unit to which the substrate is attached, wherein the guide member includes a first accommodation part, a second accommodation part, and a connection part, and passes through the chamber; forming an organic layer by depositing a deposition material discharged from an organic layer deposition assembly on the substrate while the substrate is moved relative to the organic layer deposition assembly in the chamber at a space from the substrate; separating the substrate on which the depositing has been completed from the transfer unit in an unloading unit; and transporting the transfer unit from which the substrate is separated to the loading unit by using a second conveyer unit that passes through the chamber, wherein the first accommodation part of the guide member is located closer to ground than the second accommodation part, and includes a lower member, an upper member, and elastic members between the lower member and the upper member.

The organic layer deposition assembly may include a plurality of organic layer deposition assemblies, wherein deposition may be sequentially performed on the substrate by using the plurality of organic layer deposition assemblies.

The transfer unit may be cyclically moved between the first conveyer unit and the second conveyer unit.

The transfer unit may be transferred in the chamber in non-contact with the first conveyer unit.

The organic layer deposition assembly may include a plurality of organic layer deposition assemblies for discharging different deposition materials.

In another embodiment according to the present invention, an organic light-emitting display apparatus is provided. The organic light-emitting display apparatus includes: a substrate; a first electrode on the substrate; an intermediate layer including one or more organic layers that are on the substrate, and an organic emission layer; and a second electrode on the intermediate layer, wherein the one or more organic layers on the substrate are formed via a deposition process, and a length of a slanted side between top and bottom sides of one of the one or more organic layers farther from a center of a deposition region is larger than lengths of slanted sides between the top and bottom sides of those other organic layers formed closer to the center of the deposition region.

The one or more organic layers that are formed on the substrate via the deposition process may be linearly-patterned.

In each of the one or more organic layers that are formed on the substrate via the deposition process and that are formed farther from the center of the deposition region, a slanted side between upper and lower sides that is farther from the center of the deposition region, may be larger than the other slanted side between upper and lower sides.

Two slanted sides between top and bottom sides of the organic layer formed on the substrate and disposed at the center of the deposition region may have substantially the same length.

The one or more organic layers that are located in the deposition region on the substrate may be symmetrically arranged with respect to the center of the deposition region.

The substrate may have a size of 40 inches or more.

The one or more organic layers may have a non-uniform thickness.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, the present invention will be described in detail by explaining exemplary embodiments of the present invention with reference to the attached drawings.

Figure 1:
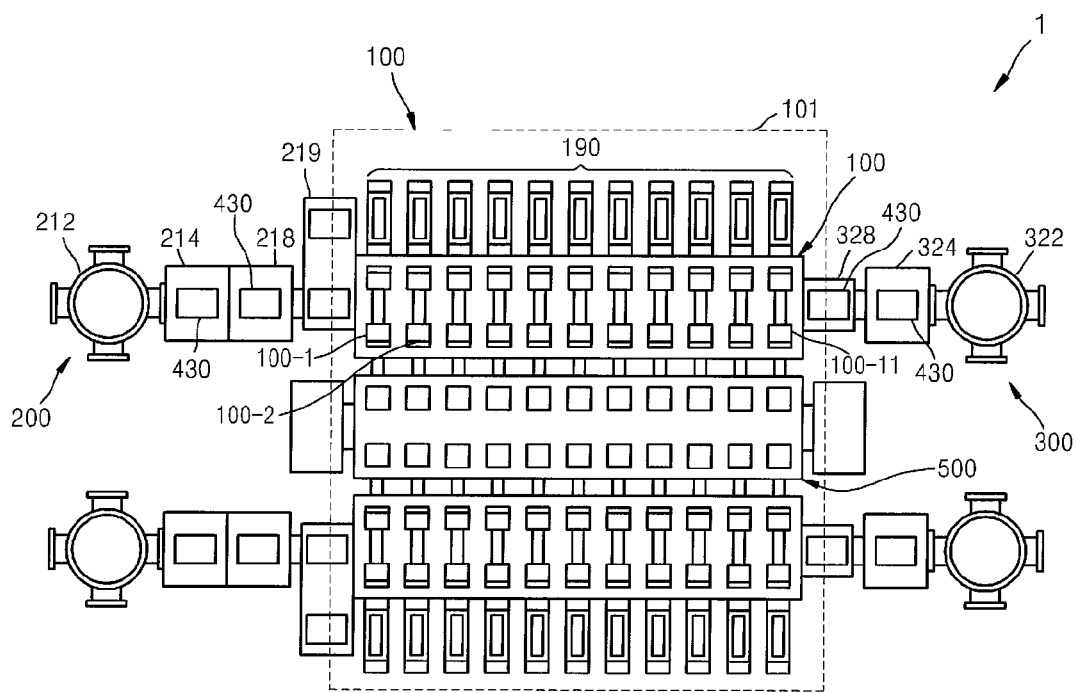
FIG. 1 is a schematic plan view illustrating a structure of an organic layer deposition apparatus according to an embodiment of the present invention.
Figure 2:
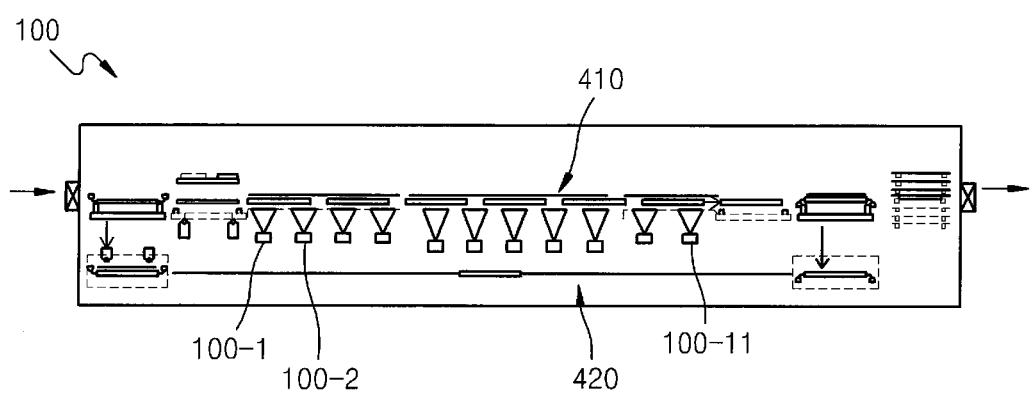
FIG. 2 is a schematic side view of a deposition unit of the organic layer deposition apparatus of FIG. 1, according to an embodiment of the present invention.

FIG. 1 is a schematic plan view illustrating a structure of an organic layer deposition apparatus 1 according to an embodiment of the present invention. FIG. 2 is a schematic side view of a deposition unit 100 of the organic layer deposition apparatus 1 of FIG. 1, according to an embodiment of the present invention.

Figure 3:
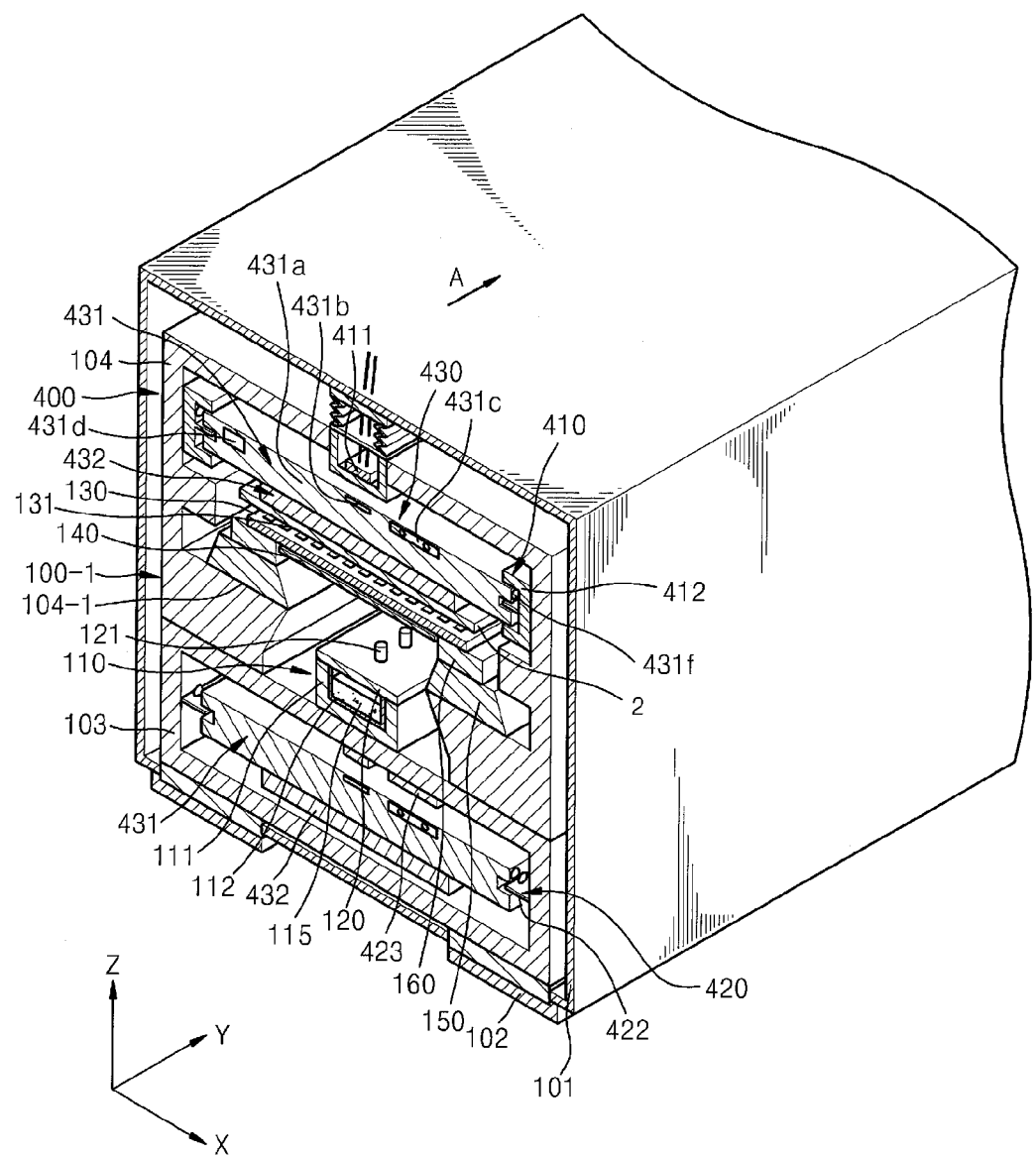
FIG. 3 is a schematic perspective view of the deposition unit of the organic layer deposition apparatus of FIG. 1, according to an embodiment of the present invention.
Figure 4:
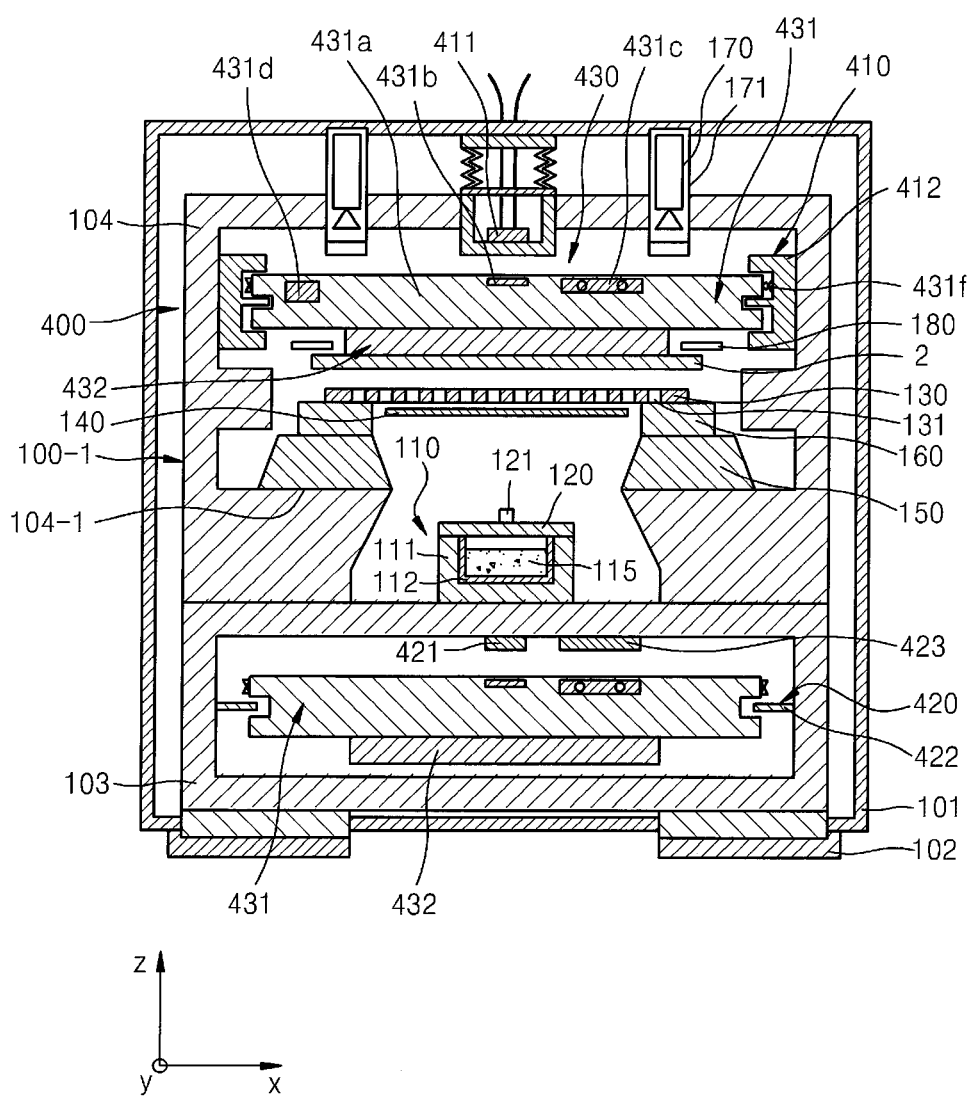
FIG. 4 is a schematic cross-sectional view of the deposition unit of FIG. 3, according to an embodiment of the present invention.

Referring to FIGS. 1 and 2, the organic layer deposition apparatus 1 includes the deposition unit 100, a loading unit 200, an unloading unit 300, and a conveyer unit 400 (refer to FIGS. 3 and 4).

The loading unit 200 may include a first rack 212, a transport chamber 214, a first inversion chamber 218, and a buffer chamber 219.

A plurality of substrates 2 (refer to FIGS. 3 and 4) onto which a deposition material has not yet been applied are stacked up on the first rack 212. A transport robot included in the transport chamber 214 picks up one of the substrates 2 from the first rack 212, places it on a transfer unit 430 transferred by a second conveyer unit 420, and moves the transfer unit 430 on which the substrate 2 is placed, into the first inversion chamber 218.

The first inversion chamber 218 is located adjacent to the transport chamber 214. The first inversion chamber 218 includes a first inversion robot that inverts the transfer unit 430 and then loads it on a first conveyer unit 410 of the deposition unit 100.

Referring to FIG. 1, the transport robot of the transport chamber 214 places one of the substrates 2 on a top surface of the transfer unit 430, and the transfer unit 430 on which the substrate 2 is placed is then transferred into the first inversion chamber 218. The first inversion robot of the first inversion chamber 218 inverts the transfer unit 430 so that the substrate 2 is turned upside down in the deposition unit 100.

The unloading unit 300 is configured to operate in an opposite manner to the loading unit 200 described above. Specifically, a second inversion robot in a second inversion chamber 328 inverts the transfer unit 430, which has passed through the deposition unit 100 while the substrate 2 is placed on the transfer unit 430, and then moves the transfer unit 430 on which the substrate 2 is placed into an ejection chamber 324. Then, an ejection robot takes the transfer unit 430 on which the substrate 2 is placed out of the ejection chamber 324, separates the substrate 2 from the transfer unit 430, and then loads the substrate 2 on a second rack 322. The transfer unit 430, separated from the substrate 2, is returned to the loading unit 200 via the second conveyer unit 420.

However, the present invention is not limited to the above example. For example, when placing the substrate 2 on the transfer unit 430, the substrate 2 may be fixed (or attached) onto a bottom surface of the transfer unit 430 and then moved into the deposition unit 100. In such an embodiment, for example, the first inversion robot of the first inversion chamber 218 and the second inversion robot of the second inversion chamber 328 may be omitted.

The deposition unit 100 may include at least one chamber for deposition. In one embodiment, as illustrated in FIGS. 1 and 2, the deposition unit 100 includes a chamber 101 in which a plurality of organic layer deposition assemblies (100-1) (100-2) . . . (100-n) may be located. Referring to FIG. 1, 11 organic layer deposition assemblies, i.e., a first organic layer deposition assembly (100-1), a second organic layer deposition assembly (100-2), through an eleventh organic layer deposition assembly (100-11), are located in the chamber 101, but the number of organic layer deposition assemblies may vary with a desired deposition material and deposition conditions. The chamber 101 is maintained in vacuum during the deposition process.

In this regard, some of the 11 organic layer deposition assemblies may be used for deposition to form a common layer, and the rest of the 11 organic layer deposition assemblies may be used for deposition to form a pattern layer. In this embodiment, the organic layer deposition assemblies used for deposition to form a common layer may not include a patterning slit sheet 130 (refer to FIG. 3). According to one embodiment, the 11 organic layer deposition assemblies may be configured such that the first organic layer deposition assembly 100-1 performs deposition for forming a hole injection layer (HIL) as a common layer, the second organic layer deposition assembly 100-2 performs deposition for forming an injection layer (IL) as a common layer, the third organic layer deposition assembly 100-3 and the fourth organic layer deposition assembly 100-4 perform deposition for forming a hole transport layer (HTL) as a common layer, the fifth organic layer deposition assembly 100-5 performs deposition for forming, e.g., an R auxiliary layer and a G auxiliary layer in the HTL as a common layer, the sixth organic layer deposition assembly 100-6 performs deposition for forming an additional R auxiliary layer in the HTL as a common layer, the seventh organic layer deposition assembly 100-7 performs deposition for forming a red emission layer (R EML) as a pattern layer, the eighth organic layer deposition assembly 100-8 performs deposition for forming a green emission layer (G EML) as a pattern layer, the ninth organic layer deposition assembly 100-9 performs deposition for forming a blue emission layer (B EML) as a pattern layer, the tenth organic layer deposition assembly 100-10 performs deposition for forming an electron transport layer (ETL) as a common layer, and the eleventh organic layer deposition assembly 100-11 performs deposition for forming an electron injection layer (EIL) as a common layer. The organic layer deposition assemblies described above, and/or other suitable organic layer deposition assemblies may also be arranged in various forms.

In the embodiment illustrated in FIG. 1, the transfer unit 430 with the substrate 2 fixed thereon (or attached thereto) may be moved at least to the deposition unit 100, or may be moved sequentially to the loading unit 200, the deposition unit 100, and the unloading unit 300, by the first conveyer unit 410, and the transfer unit 430 that is separated from the substrate 2 in the unloading unit 300, may be moved back to the loading unit 200 by the second conveyer unit 420.

The first conveyer unit 410 passes through the chamber 101 when passing through the deposition unit 100, and the second conveyer unit 420 conveys the transfer unit 430 from which the substrate 2 is separated.

In the present embodiment, the organic layer deposition apparatus 1 is configured such that the first conveyer unit 410 and the second conveyer unit 420 are respectively disposed above and below so that after the transfer unit 430, on which deposition has been completed while passing through the first conveyer unit 410, is separated from the substrate 2 in the unloading unit 300, the transfer unit 430 is returned to the loading unit 200 via the second conveyer unit 420 formed below the first conveyer unit 410, whereby the organic layer deposition apparatus 1 may have an improved space utilization efficiency.

In an embodiment, the deposition unit 100 of FIG. 1 may further include a deposition source replacement unit 190 located at a side of each organic layer deposition assembly. Although not particularly illustrated in the drawings, the deposition source replacement unit 190 may be formed as a cassette-type that may be drawn to the outside from each organic layer deposition assembly. Thus, a deposition source 110 (refer to FIG. 3) of the organic layer deposition assembly 100-1 may be easily replaced.

FIG. 1 illustrates the organic layer deposition apparatus 1 in which two sets of structures each including the loading unit 200, the deposition unit 100, the unloading unit 300, and the conveyer unit 400 are arranged in parallel. That is, it can be seen that two organic layer deposition apparatuses 1 are respectively arranged at one side and another side of the organic deposition apparatus 1 (above and below in FIG. 1). In such an embodiment, a patterning slit sheet replacement unit 500 may be located between the two organic layer deposition apparatuses 1. That is, due to this configuration of structures, the two organic layer deposition apparatuses 1 share the patterning slit sheet replacement unit 500, resulting in improved space utilization efficiency, as compared to a case where each organic layer deposition apparatus 1 includes the patterning slit sheet replacement unit 500.

Figure 5:
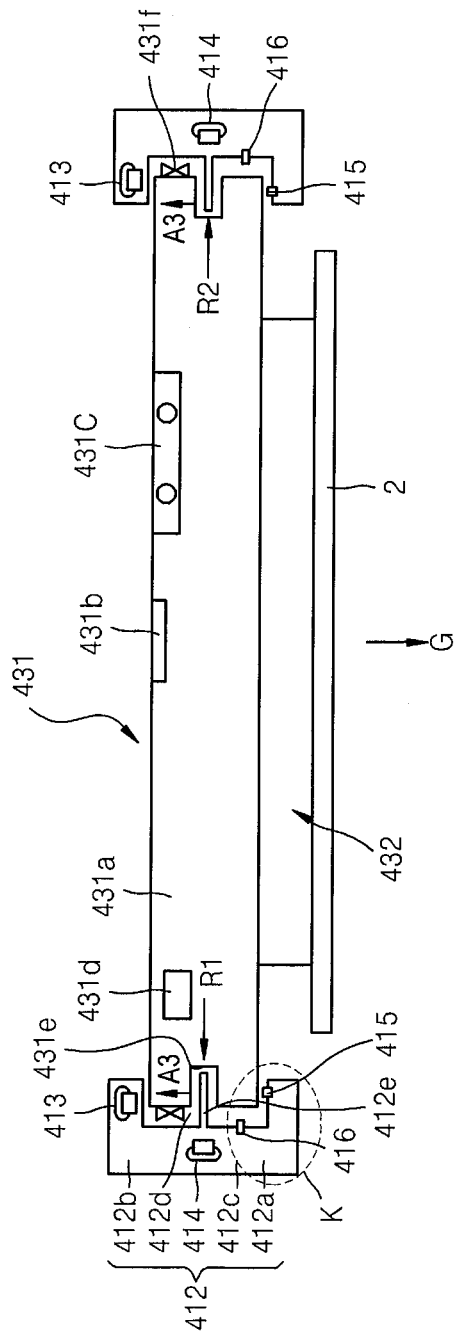
FIG. 5 is a schematic cross-sectional view particularly illustrating a carrier and guide members of the deposition unit of FIG. 3, according to an embodiment of the present invention.
Figure 6A:
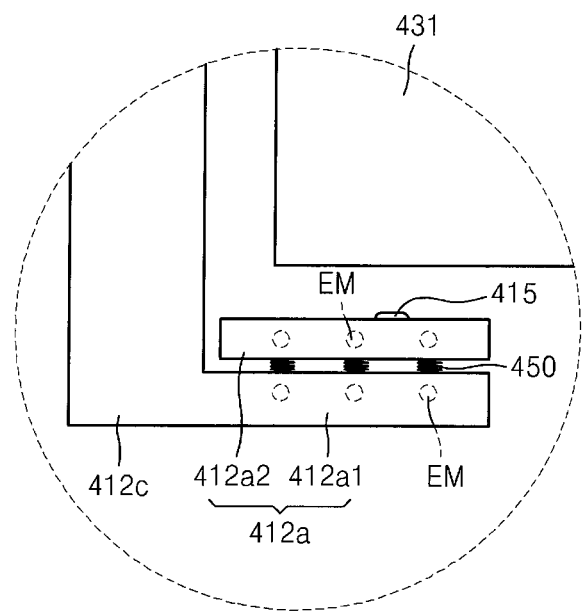
FIGS. 6A and 6B are schematic diagrams illustrating portion K of FIG. 5.
Figure 6B:
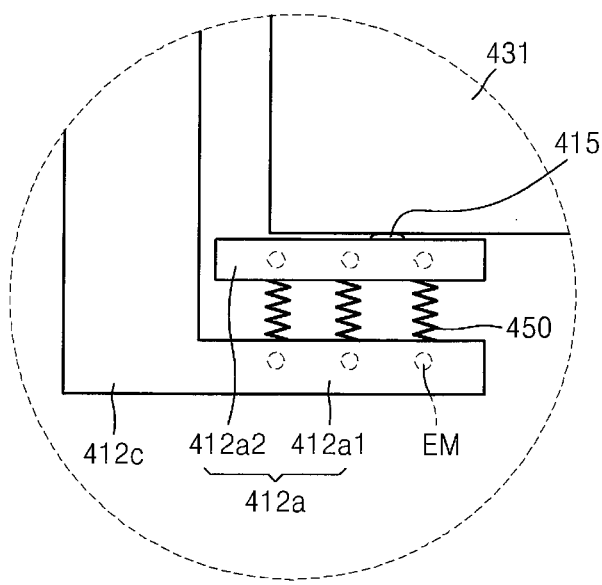

FIG. 3 is a schematic perspective view of the deposition unit 100 of the organic layer deposition apparatus 1 of FIG. 1, according to an embodiment of the present invention. FIG. 4 is a schematic cross-sectional view of the deposition unit 100 of FIG. 3, according to an embodiment of the present invention. FIG. 5 is a schematic cross-sectional view particularly illustrating a carrier 431 and guide members 412 of the deposition unit 100 of FIG. 3, according to an embodiment of the present invention. FIGS. 6A and 6B are schematic diagrams illustrating portion K of FIG. 5.

Referring to FIGS. 3 and 4, the deposition unit 100 of the organic layer deposition apparatus 1 includes at least one organic layer deposition assembly 100-1 and a conveyer unit 400.

Hereinafter, an overall structure of the deposition unit 100 will be described.

The chamber 101 may be formed as a hollow box type and accommodate the at least one organic layer deposition assembly 100-1 and the transfer unit 430. In another descriptive manner, a foot 102 is formed so as to fix the deposition unit 100 on the ground, a lower housing 103 is located on the foot 102, and an upper housing 104 is located on the lower housing 103. The chamber 101 accommodates both the lower housing 103 and the upper housing 104. In this regard, a connection part of the lower housing 103 and the chamber 101 is sealed so that the inside of the chamber 101 is completely isolated from the outside. Due to the structure in which the lower housing 103 and the upper housing 104 are located on the foot 102 fixed on the ground, the lower housing 103 and the upper housing 104 may be maintained in a fixed position even though the chamber 101 is repeatedly contracted and expanded. Thus, the lower housing 103 and the upper housing 104 may serve as a reference frame in the deposition unit 100.

The upper housing 104 includes the organic layer deposition assembly 100-1 and the first conveyer unit 410 of the conveyer unit 400, and the lower housing 103 includes the second conveyer unit 420 of the conveyer unit 400. While the transfer unit 430 is cyclically moving between the first conveyer unit 410 and the second conveyer unit 420, a deposition process is continuously performed.

Hereinafter, constituents of the organic layer deposition assembly 100-1 are described in detail.

The first organic layer deposition assembly 100-1 includes the deposition source 110, a deposition source nozzle unit 120, the patterning slit sheet 130, a shielding member 140, a first stage 150, a second stage 160, a camera (e.g., cameras) 170, and a sensor (e.g., sensors) 180. In this regard, all the elements illustrated in FIGS. 3 and 4 may be arranged in the chamber 101 maintained in an appropriate vacuum state. This structure is used to achieve the linearity of a deposition material.

For example, in order to deposit a deposition material 115 that has been discharged from the deposition source 110 and passed through the deposition source nozzle unit 120 and the patterning slit sheet 130, onto the substrate 2 in a desired pattern, it is desirable to maintain the chamber (not shown) in the same vacuum state as that used in a deposition method using a fine metal mask (FMM). In addition, the temperature of the patterning slit sheet 130 should be sufficiently lower than that of the deposition source 110 (about 100° C. or less) because thermal expansion of the patterning slit sheet 130 is reduced or minimized when the temperature of the patterning slit sheet 130 is sufficiently low.

The substrate 2 on which the deposition material 115 is to be deposited is arranged in the chamber 101. The substrate 2 may be a substrate for a flat panel display device. For example, a large substrate, such as a mother glass, for manufacturing a plurality of flat panel displays, may be used as the substrate 2.

According to the present embodiment, the deposition process may be performed with the substrate 2 being moved relative to the organic layer deposition assembly 100-1.

In a conventional deposition method using an FMM, the size of the FMM is the same as that of a substrate. Thus, as the size of the substrate increases, the FMM also needs to be large in size. Due to these problems, it is difficult to fabricate the FMM and to align the FMM in a precise pattern by elongation of the FMM.

To address these problems, in the organic layer deposition assembly 100-1 according to the present embodiment, deposition may be performed while the organic layer deposition assembly 100-1 and the substrate 2 are moved relative to each other. In other words, deposition may be continuously performed while the substrate 2, which faces the organic layer deposition assembly 100-1, is moved in a Y-axis direction. That is, deposition is performed in a scanning manner while the substrate 2 is moved in a direction of arrow A illustrated in FIG. 3. Although the substrate 2 is illustrated as being moved in the Y-axis direction in the chamber 101 in FIG. 3 when deposition is performed, the present invention is not limited thereto. For example, deposition may be performed while the organic layer deposition assembly 100-1 is moved in the Y-axis direction and the substrate 2 is held in a fixed position.

Thus, in the organic layer deposition assembly 100-1, the patterning slit sheet 130 may be much smaller than an FMM used in a conventional deposition method. In other words, in the organic layer deposition assembly 100-1, deposition is continuously performed, i.e., in a scanning manner while the substrate 2 is moved in the Y-axis direction. Thus, at least one of the lengths of the patterning slit sheet 130 in X-axis and Y-axis directions may be much less than a length of the substrate 2. Since the patterning slit sheet 130 may be formed much smaller than the FMM used in a conventional deposition method, it is relatively easy to manufacture the patterning slit sheet 130. That is, the small patterning slit sheet 130 is more suitable in view of the manufacturing processes, including etching followed by precise elongation, welding, transferring, and washing processes, than the FMM used in a conventional deposition method. In addition, this is more suitable for manufacturing a relatively large display device.

In order to perform deposition while the organic layer deposition assembly 100-1 and the substrate 2 are moved relative to each other as described above, the organic layer deposition assembly 100-1 and the substrate 2 may be spaced apart from each other by a certain distance (e.g., a gap). This is described below in more detail.

The deposition source 110 that contains and heats the deposition material 115 is located at a side opposite to (facing) a side in which the substrate 2 is located in the chamber. As the deposition material 115 contained in the deposition source 110 is vaporized, deposition is performed on the substrate 2.

The deposition source 110 includes a crucible 111 that is filled with the deposition material 115 and a heater 112 that heats the crucible 111 so as to vaporize the deposition material 115 toward a side of the crucible 111 filled with the deposition material 115, in particular, toward the deposition source nozzle unit 120.

The deposition source 110, in one embodiment, is disposed at a side of the deposition source 110 facing the substrate 2.

Here, in the organic layer deposition assembly 100-1, deposition source nozzles may be differently formed for deposition to form a common layer and a pattern layer. That is, in the deposition source nozzle unit 120, to form the pattern layer, a plurality of deposition source nozzles 121 may be formed along the Y-axis direction, i.e., a scanning direction of the substrate 2. Thus, in the present embodiment, the deposition source nozzles 121 are formed such that only one deposition source nozzle 121 is formed along the X-axis direction, to reduce (e.g., significantly reduce) the occurrence of shadows. On the other hand, although not illustrated, in the deposition source nozzle unit 120, to form the common layer, the deposition source nozzles 121 may be formed along the X-axis direction. By doing so, a thickness uniformity of the common layer may be improved.

In one embodiment, the patterning slit sheet 130 is located between the deposition source 110 and the substrate 2. The patterning slit sheet 130 may be attached to a frame (not shown) having a shape similar to a window frame.

The patterning slit sheet 130 includes a plurality of patterning slits 131 arranged along the X-axis direction. The deposition material 115 that has been vaporized in the deposition source 110 passes through the deposition source nozzle unit 120 and the patterning slit sheet 130 and is then deposited onto the substrate 2. In this regard, the patterning slit sheet 130 may be formed using the same method as that used to form an FMM, in particular, a stripe-type mask, e.g., etching. In this regard, a total number of patterning slits 131 may be more than a total number of deposition source nozzles 121.

Hereinafter, particular disposition of each element of the upper housing 104 will be described.

The deposition source 110 and the deposition source nozzle unit 120 are located at a bottom portion of the upper housing 104. Accommodation portions 104-1 are respectively formed on both sides of the deposition source 100 and the deposition source nozzle unit 120 to have a protruding shape. The first stage 150, the second stage 160, and the patterning slit sheet 130 are sequentially formed (or located) on the accommodation portions 104-1 in this order.

In this regard, the first stage 150 is formed to move in X-axis and Y-axis directions so that the first stage 150 aligns the patterning slit sheet 130 in the X-axis and Y-axis directions. That is, the first stage 150 includes a plurality of actuators so that the first stage 150 is moved in the X-axis and Y-axis directions with respect to the upper housing 104.

The second stage 160 is formed to move in a Z-axis direction so as to align the patterning slit sheet 130 in the Z-axis direction. That is, the second stage 160 includes a plurality of actuators and is formed to move in the Z-axis direction with respect to the first stage 150.

The patterning slit sheet 130 is located on the second stage 160. The patterning slit sheet 130 is located on the first stage 150 and the second stage 160 so as to move in the X-axis, Y-axis, and Z-axis directions, and thus, an alignment, in particular, a real-time alignment, between the substrate 2 and the patterning slit sheet 130, may be performed.

In addition, the upper housing 104, the first stage 150, and the second stage 160 may guide a flow path of the deposition material 115 such that the deposition material 115 discharged through the deposition source nozzles 121 is not dispersed outside the flow path. That is, the flow path of the deposition material 115 is sealed by the upper housing 104, the first stage 150, and the second stage 160, and thus, the movement of the deposition material 115 in the X-axis and Y-axis directions may be thereby concurrently or simultaneously guided.

The shielding member 140 may be located between the patterning slit sheet 130 and the deposition source 110. In particular, an anode or cathode pattern is formed on an edge portion of the substrate 2 and is used as a terminal for inspecting a product or in manufacturing a product. If an organic material is applied on this region (i.e., the region on which the anode or cathode pattern is formed) of the substrate 2, the anode or the cathode cannot sufficiently perform its function.

Thus, the edge portion of the substrate 2 is formed to be a non-film-forming region on which an organic material or the like is not applied. As described above, however, in the organic layer deposition apparatus, deposition is performed in a scanning manner while the substrate 2 is moved relative to the organic layer deposition apparatus, and thus, it is not easy to prevent the organic material from being deposited on the non-film-forming region of the substrate 2.

Therefore, to prevent the organic material from being deposited on the non-film-forming region of the substrate 2, in the organic layer deposition apparatus, the shielding member 140 may be located at the edge portion of the substrate 2. Although not particularly illustrated in FIGS. 3 and 4, the shielding member 140 may include two adjacent plates.

When the substrate 2 does not pass through the organic layer deposition assembly 100-1, the shielding member 140 screens the deposition source 110, and thus, the deposition material 115 discharged from the deposition source 110 does not reach the patterning slit sheet 130. When the substrate 2 enters into the organic layer deposition assembly 100-1 with the shielding member 140 screening the deposition source 110, a front part of the shielding member 140 which screens the deposition source 110 moves along with the movement of the substrate 2, and thus, the flow path of the deposition material 115 is opened, and the deposition material 115 discharged from the deposition source 110 passes through the patterning slit sheet 130 and is deposited on the substrate 2. Also, while the substrate 2 is passing through the organic layer deposition assembly 100-1, a rear part of the shielding member 140 moves along with the movement of the substrate 2 to screen the deposition source 110 so that the flow path of the deposition material 115 is closed. Accordingly, the deposition material 115 discharged from the deposition source 110 does not reach the patterning slit sheet 130.

As described above, the non-film-forming region of the substrate 2 is screened by the shielding member 140, and thus, it may be possible or relatively easy to prevent the organic material from being deposited on the non-film-forming region of the substrate 2 without using a separate structure.

Hereinafter, the conveyer unit 400 that conveys (e.g., transports) the substrate 2, on which the deposition material 115 is to be deposited, is described in more detail. Referring to FIGS. 3, 4, 5, 6A and 6B, the conveyer unit 400 includes the first conveyer unit 410, the second conveyer unit 420, and the transfer unit 430.

The first conveyer unit 410 conveys (or transports) in an in-line manner the transfer unit 430 and the substrate 2 so that an organic layer may be formed on the substrate 2 by the organic layer deposition assembly 100-1. The transfer unit 430 includes the carrier 431 and an electrostatic chuck 432 attached thereto, wherein the substrate 2 is moved by being attached to the transfer unit 430. Also, the first conveyer unit 410 includes a coil 411, guide members 412, upper magnetically suspended (e.g., magnetically levitating) bearings 413, side magnetically suspended (e.g., magnetically levitating) bearings 414, and gap sensors 415 and 416.

The second conveyer unit 420 returns to the loading unit 200 the transfer unit 430 from which the substrate 2 has been separated in the unloading unit 300 after one deposition cycle is completed while the transfer unit 430 is passing through the deposition unit 100. The second conveyer unit 420 includes a coil 421, roller guides 422, and a charging track 423.

The transfer unit 430 includes the carrier 431 that is conveyed (i.e., transported) along the first conveyer unit 410 and the second conveyer unit 420 and the electrostatic chuck 432 that is combined on (or attached to) a surface of the carrier 431. The substrate 2 is attached to the electrostatic chuck 432.

Each element of the conveyer unit 400 will be described in more detail.

First, the carrier 431 of the transfer unit 430 will now be described in detail.

The carrier 431 includes a main body part 431a, a magnetic rail 431b, contactless power supply (CPS) modules 431c, a power supply unit 431d, and guide grooves 431e. The carrier 431 may further include cam followers 431f (refer to FIG. 5).

The main body part 431a constitutes a base part of the carrier 431 and may be formed of a magnetic material such as iron. In this regard, due to a repulsive force between the main body part 431a and the respective upper and side magnetically suspended (e.g., magnetically levitating) bearings 413 and 414, which are described below, the carrier 431 may be maintained spaced apart from the guide members 412 by a certain distance.

The guide grooves 431e may be respectively formed at both sides of the main body part 431a and each may accommodate a guide protrusion 412e of the guide member 412.

The magnetic rail 431b may be formed along a center line of the main body part 431a in a direction where the main body part 431a proceeds. The magnetic rail 431b and the coil 411, which are described below in more detail, may be combined with each other to constitute a linear motor, and the carrier 431 may be conveyed (or transported) in an arrow A direction by the linear motor.

The CPS modules 431c and the power supply unit 431d may be respectively formed on both sides of the magnetic rail 431b in the main body part 431a. The power supply unit 431d includes a battery (e.g., a rechargeable battery) that provides power so that the electrostatic chuck 432 can chuck (e.g., hold, attach to, or be fixed to) the substrate 2 and maintains operation. The CPS modules 431c are wireless charging modules that charge the power supply unit 431d. In particular, the charging track 423 formed in the second conveyer unit 420, which are described below, is connected to an inverter (not shown), and thus, when the carrier 431 is transferred into the second conveyer unit 420, a magnetic field is formed between the charging track 423 and the CPS modules 431c so as to supply power to the CPS module 431c. The power supplied to the CPS modules 431c is used to charge the power supply unit 431d.

The electrostatic chuck 432 may include an electrode embedded in a main body formed of ceramic, wherein the electrode is supplied with power. The substrate 2 is attached onto a surface of the main body of the electrostatic chuck 432 as a high voltage is applied to the electrode.

Hereinafter, the first conveyer unit 410 and the transfer unit 430 are described in detail.

The first conveyer unit 410 conveys (or transports) the electrostatic chuck 432 that fixes the substrate 2 and the carrier 431 that conveys (or transports) the electrostatic chuck 432. In this regard, the first conveyer unit 410 includes the coil 411, the guide members 412, the upper magnetically suspended (e.g., magnetically levitating) bearings 413, the side magnetically suspended (e.g., magnetically levitating) bearings 414, and the gap sensors 415 and 416.

The coil 411 and the guide members 412 are formed inside the upper housing 104. The coil 411 is formed in an upper portion of the upper housing 104, and the guide members 421 are respectively formed on both inner sides of the upper housing 104. The coil 411 will be described below.

The guide members 412 guide the carrier 431 to move in a direction. In this regard, the guide members 412 are formed to pass through the deposition unit 100.

In particular, the guide members 412 accommodate both sides of the carrier 431 to guide the carrier 431 to move along in the direction of the arrow A illustrated in FIG. 3. In this regard, the guide member 412 includes a first accommodation part 412a positioned below the carrier 431, a second accommodation part 412b positioned above the carrier 431, and a connection part 412c that connects the first accommodation part 412a to the second accommodation part 412b.

An accommodation groove 412d is formed by the first accommodation part 412a, the second accommodation part 412b, and the connection part 412c. Both sides of the carrier 431 are respectively accommodated in the accommodation grooves 412d, and the carrier 431 is moved along the accommodation grooves 412d.

The side magnetically suspended (e.g., magnetically levitating) bearings 414 are each disposed in the connection part 412c of the guide member 412 so as to respectively correspond to both sides of the carrier 431. The side magnetically suspended bearings 414 cause a distance (e.g., a space or a gap) between the carrier 431 and the guide member 412 so that the carrier 431 is moved along the guide members 412 in non-contact with the guide members 412. That is, a repulsive force R1 occurring between the side magnetically suspended bearing 414 on the left side in FIG. 5 and the carrier 431, which is a magnetic material, and a repulsive force R2 occurring between the side magnetically suspended bearing 414 on the right side in FIG. 5 and the carrier 431, which is a magnetic material, maintain equilibrium, and thus, there is a constant distance (or substantially constant distance) between the carrier 431 and the respective parts of the guide member 412.

Each upper magnetically suspended bearing 413 may be located in the second accommodation part 412b so as to be above the carrier 431. The upper magnetically suspended bearings 413 enable the carrier 431 to be moved along the guide members 412 in non-contact with the first and second accommodation parts 412a and 412b and with a distance therebetween maintained constant (or substantially constant). That is, an attractive force A3 occurring between the upper magnetically suspended bearing 413 and the carrier 431, which is a magnetic material, and gravity G maintain equilibrium (or substantial equilibrium), and thus, there is a constant distance (or a substantially constant distance) between the carrier 431 and the respective guide members 412.

Each guide member 412 may further include the gap sensor 415. The gap sensor 415 may measure a distance between the carrier 431 and the guide member 412. The gap sensor 415 may be located in the first accommodation part 412a so as to correspond to a bottom portion of the carrier 431. The gap sensor 415 located in the first accommodation part 412a may measure a distance between the first accommodation part 412a and the carrier 431. The gap sensor 416 may be located at a side of the side magnetically suspended bearing 414. The gap sensor 416 may measure a distance between a side surface of the carrier 431 and the side magnetically suspended bearing 414. The present invention is not limited to the above example, and the gap sensor 416 may be located in the connection part 412c.

Magnetic forces of the upper and side magnetically suspended bearings 413 and 414 may vary according to values measured by the gap sensors 415 and 416, and thus, distances between the carrier 431 and the respective guide members 412 may be adjusted in real time. That is, a precise transfer of the carrier 431 may be feedback controlled using the upper and side magnetically suspended bearings 413 and 414 and the gap sensors 415 and 416.

Referring to FIGS. 6A and 6B, the first accommodation part 412a of the guide member 412 includes a lower member 412a1 and an upper member 412a2 that are connected to each other by using elastic members 450.

Also, the lower member 412a1 and the upper member 412a2 of the first accommodation part 412a include electromagnets EM within them. When a power is supplied to the electromagnets EM, magnetic attraction is generated between the lower member 412a1 and the upper member 412a2, so that, as illustrated in FIG. 6A, the lower member 412a1 and the upper member 412a2 are very close to each other, and the elastic members 450 therebetween are maximally constricted (or compressed).

However, when the power supply to the electromagnets EM is cut, the lower member 412a1 and the upper member 412a2 are no longer magnetic, so that there is no magnetic attraction therebetween, the constricted elastic members 450 are restored, and then a distance between the lower member 412a1 and the upper member 412a2 increases. That is, the upper member 412a2 rises upward, so that the upper member 412a2 contacts the bottom portion of the carrier 431.

As described above, the carrier 431 according to the present embodiment moves along the guide members 412 while the constant distance (or substantially constant distance) between the carrier 431 and the respective parts of the guide member 412 is maintained without a collision therebetween, due to the upper magnetically suspended bearings 413 and the side magnetically suspended bearings 414.

However, when the upper magnetically suspended bearings 413 and the side magnetically suspended bearings 414 stop operating due to an error in an entire system of the organic layer deposition apparatus 1, a defect of the upper magnetically suspended bearings 413 and the side magnetically suspended bearings 414, or a power supply error, the carrier 431 drops in a direction of gravity G of FIG. 5 and thus collides with the guide member 412, specifically, the first accommodation part 412a of the guide member 412. Due to this, the guide member 412 and the carrier 431 may be seriously damaged and thus the organic layer deposition apparatus 1 may not normally operate (e.g., may not operate properly).

In the present embodiment, the first accommodation part 412a of the guide member 412 includes the lower member 412a1 and the upper member 412a2 that are connected to each other by using the elastic members 450, and the lower member 412a1 and the upper member 412a2 include the electromagnets EM within them. By doing so, in a normal state as illustrated in FIG. 6A, the lower member 412a1 and the upper member 412a2 are close to each other due to the magnetic attraction therebetween, which is generated by the electromagnets EM, and then in an abnormal state as illustrated in FIG. 6B, i.e., when the upper magnetically suspended bearings 413 and the side magnetically suspended bearings 414 stop operating and thus the carrier 431 drops due to gravity G, the constricted elastic members 450 are restored so that the distance between the lower member 412a1 and the upper member 412a2 increases. That is, the upper member 412a2 rises upward and thus the upper member 412a2 contacts the bottom portion of the carrier 431, so that a collision with the carrier 431 is relieved by the upper member 412a2 that is connected with the elastic members 450, and thus the carrier 431 is stably supported. By doing so, it is possible to prevent or reduce damage to the carrier 431 and the guide member 412.

FIG. 6B illustrates a case in which the gap sensor 415 contacts the bottom portion of the carrier 431 but aspects of the present invention are not limited thereto. That is, in order to prevent the gap sensor 415 from protruding from a top surface of the upper member 412a2 of the first accommodation part 412a, a groove may be formed in the first accommodation part 412a, and then the gap sensor 415 may be located in the groove. In that case, the carrier 431 contacts the top surface of the upper member 412*a*2 of the first accommodation part 412*a*.

Hereinafter, an operation of the transfer unit 430 is described in more detail.

The magnetic rail 431*b* of the main body part 431*a* and the coil 411 may be combined with each other to constitute an operation unit. In this regard, the operation unit may be a linear motor. The linear motor has a small frictional coefficient, little position error, and a very high degree of position determination, as compared to a conventional slide guide system. As described above, the linear motor may include the coil 411 and the magnetic rail 431*b*. The magnetic rail 431*b* is linearly arranged on the carrier 431, and a plurality of the coils 411 may be located at an inner side of the chamber 101 by a certain distance so as to face the magnetic rail 431*b*. Since the magnetic rail 431*b* is arranged on the carrier 431 instead of the coil 411, the carrier 431 may be operable without power being supplied thereto.

In this regard, the coil 411 may be formed in an atmosphere (ATM) box. In particular, even though the linear motor generally has a very high degree of position determination as compared to a conventional slide guide system, it is difficult to use the linear motor in a vacuum environment due to the outgassing of the coil. In a conveying system (e.g., transport system) employed in the organic layer deposition apparatus according to the present embodiment, however, the magnetic rail 431*b* and the coil 411 may be operated by being spaced apart from each other by a distance of approximately 5 mm, and thus, the coil 411 is included in the ATM box in an air atmosphere and the carrier 431 to which the magnetic rail 431*b* is attached may be moved in the chamber 101 maintained in vacuum.

Hereinafter, the second conveyer unit 420 and the transfer unit 430 are described in detail.

The second conveyer unit 420 returns the electrostatic chuck 432 from which the substrate 2 has been separated in the unloading unit 300 and the carrier 431 that carries the electrostatic chuck 432 to the loading unit 200. In this regard, the second conveyer unit 420 includes the coil 421, the roller guides 422, and the charging track 423.

For example, the coil 421, the roller guides 422, and the charging track 423 may be positioned inside the lower housing 103. The coil 421 and the charging track 423 may be located on a top inner surface of the lower housing 103, and the roller guides 422 may be located on both inner sides of the lower housing 103. Although not illustrated in FIG. 4, the coil 421 may be located in an ATM box, as the coil 411 of the first conveyer unit 410.

Like the first conveyer unit 410, the second conveyer unit 420 may include the coil 421. Also, the magnetic rail 431*b* of the main body part 431*a* of the carrier 431 and the coil 421 are combined with each other to constitute an operation unit. In this regard, the operation unit may be (or include) a linear motor. The carrier 431 may be moved by the linear motor along a direction opposite to the direction of the arrow A illustrated in FIG. 3.

The roller guides 422 guide the carrier 431 to move in a direction. In this regard, the roller guides 422 are formed to pass through the deposition unit 100. In particular, the roller guides 422 support cam followers 431*f* (see FIGS. 4 and 5) respectively formed on both sides of the carrier 431 to guide the carrier 431 to move along a direction opposite to the direction of arrow A illustrated in FIG. 3. That is, the carrier 431 is moved with the cam followers 431*f* located on both sides of the carrier 431 respectively rotating along the roller guides 422. In this regard, the cam followers 431*f* are utilized as bearings used to accurately repeat a particular operation. In an embodiment, a plurality of the cam followers 431*f* are formed on a side surface of the carrier 431 and serve as a wheel for conveying (or transporting) the carrier 431 in the second conveyer unit 420.

As a result, the second conveyer unit 420 is used in a process of returning the carrier 431 from which the substrate 2 has been separated and not in a process of depositing an organic material on the substrate 2, and thus, position accuracy (or positional accuracy) thereof is not needed as by the first conveyer unit 410. Therefore, magnetic suspension is applied to the first conveyer unit 410 that requires high position accuracy, thereby obtaining position accuracy, and a conventional roller method may be applied to the second conveyer unit 420 that requires relatively low position accuracy, thereby reducing manufacturing costs and simplifying a structure of the organic layer deposition apparatus. Although not illustrated, the magnetic suspension may also be applied to the second conveyer unit 420 as in the first conveyer unit 410.

The organic layer deposition assembly 100-1 of the organic layer deposition apparatus 1 according to the present embodiment may further include the cameras 170 and the sensors 180 for an aligning process.

In more detail, the cameras 170 may align in real time with a first alignment mark (not shown) formed in the patterning slit sheet 130 or formed in a frame (not shown) combined with the patterning slit sheet 130, and a second alignment mark (not shown) formed on the substrate 2. In this regard, the cameras 170 is positioned for a more accurately view in the chamber 101 maintained in vacuum during deposition. For this, the cameras 170 may be installed in camera accommodation units 171 in an atmospheric state. That is, a hall (or halls) is formed in the chamber 101 to correspond to the cameras 170, and thus, the cameras 170 are opened to the outside, and the camera accommodation units 171 are formed to extend from the halls. Thus, the cameras 170 may be installed in the camera accommodation units 171 in an atmospheric state, and the inside of the chamber 101 may still be maintained in a vacuum state. Due to such a structure, even though the chamber 101 is repeatedly contracted and expanded, the camera accommodation units 171 and the cameras 170 respectively accommodated therein may be maintained in a fixed position. Therefore, the cameras 170 may have a more accurate view in the chamber 101 maintained in vacuum during deposition.

Since the substrate 2 and the patterning slit sheet 130 are spaced apart from each other by a certain distance, distances to the substrate 2 and the patterning slit sheet 130 that are located at different positions are both measured using the camera 170. For this operation, the organic layer deposition assembly 100-1 of the organic layer deposition apparatus 1 may include the sensors 180. In this regard, each of the sensors 180 may be a confocal sensor. The confocal sensor may scan an object to be measured by using laser beams that rotate at high speed by using a scanning mirror and measure a distance to the object by using fluorescent or reflected rays emitted by the laser beams. The confocal sensor may measure a distance by sensing a boundary interface between different media.

That is, the sensors 180, each of which may be a confocal sensor, are located in the chamber 101 and positioned on the substrate 2. The confocal sensor may measure a distance to a top surface of the substrate 2 by sensing a boundary interface between the top surface of the substrate 2 and a space, and measure a distance to a bottom surface of the substrate 2 by sensing a boundary interface between the bottom surface of the substrate 2 and a space. In addition, the sensors 180 may measure a distance to a top surface of the patterning slit sheet 130 by sensing a boundary interface between a space and the patterning slit sheet 130. Consequently, the sensors 180 may obtain a distance between the substrate 2 and the patterning slit sheet 130 by measuring a distance to the bottom surface of the substrate 2 and a distance to the top surface of the patterning slit sheet 130.

Since a distance between the substrate 2 and the patterning slit sheet 130 is measurable in real time using the cameras 170 and the sensors 180, the substrate 2 may be aligned with the patterning slit sheet 130 in real time, whereby position accuracy (or positional accuracy) of a pattern may be improved (e.g., significantly improved).

In the organic layer deposition apparatus 1 according to the present embodiment, the carrier 431 moves by maintaining a certain distance from the guide members 412, so that the substrate 2 is conveyed (or transported). In more detail, the carrier 431 is spaced apart from the guide members 412 by a certain distance by using magnetic suspension (e.g., magnetic levitation).

Here, when a magnetic suspension operation is not appropriately performed due to an error in the organic layer deposition apparatus 1, or a power supply error, the certain distance between the carrier 431 and the guide members 412 is not maintained. That is, the carrier 431 drops in a gravity direction and thus collides with the guide members 412, such that a damage may occur.

However, in the organic layer deposition apparatus 1 according to the present embodiment, the first accommodation part 412a of the guide member 412 includes the lower member 412a1 and the upper member 412a2 that are connected to each other by using the elastic members 450, and the lower member 412a1 and the upper member 412a2 include the electromagnets EM within them. By doing so, in a normal state in which the magnetic suspension operation is normally performed, the lower member 412a1 and the upper member 412a2 are close to each other due to the magnetic attraction therebetween, and in an abnormal state in which the magnetic suspension operation stops such that the carrier 431 drops, a magnetic force of the electromagnets EM of the lower member 412a1 and the upper member 412a2 is relieved, and the constricted elastic members 450 are restored so that the distance between the lower member 412a1 and the upper member 412a2 increases. That is, the upper member 412a2 rises upward and thus the upper member 412a2 contacts the bottom portion of the carrier 431, so that a collision with the carrier 431 is relieved by the upper member 412a2 that is connected with the elastic members 450, and thus the carrier 431 is stably supported. By doing so, it is possible to prevent or reduce damage to the carrier 431 and the guide member 412.

Figure 7:
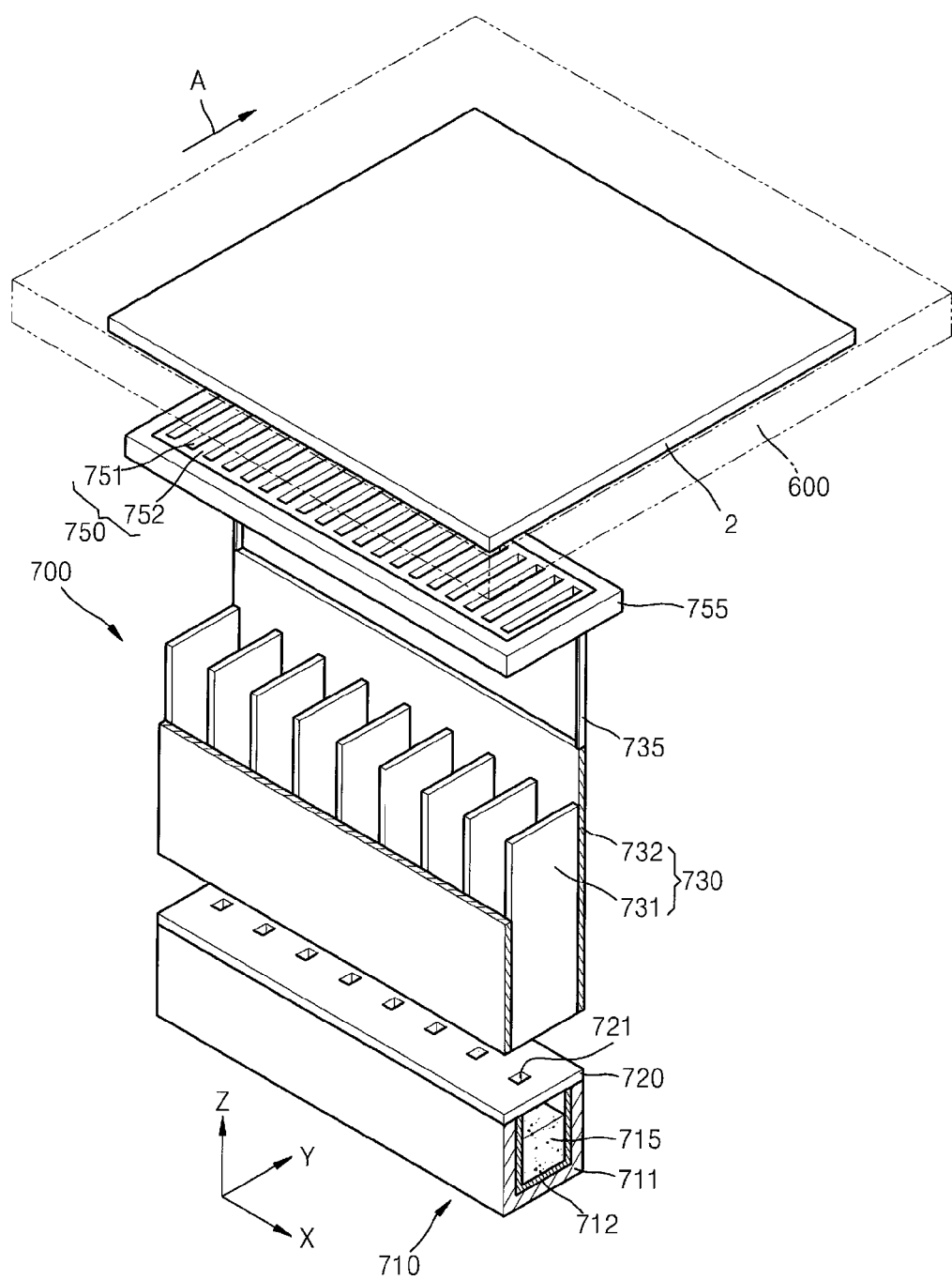
FIG. 7 is a schematic perspective view of an organic layer deposition assembly according to another embodiment of the present invention.
Figure 8:
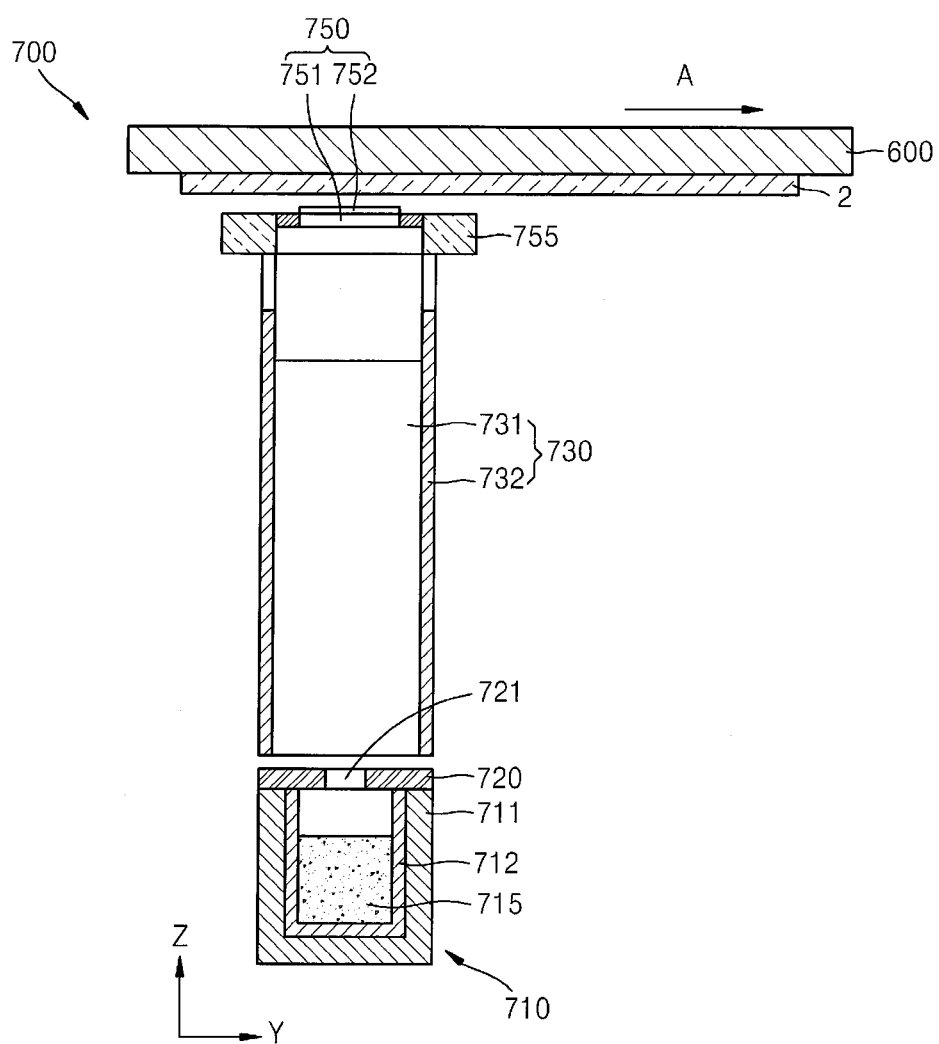
FIG. 8 is a schematic cross-sectional side view of the organic layer deposition assembly of FIG. 7.
Figure 9:
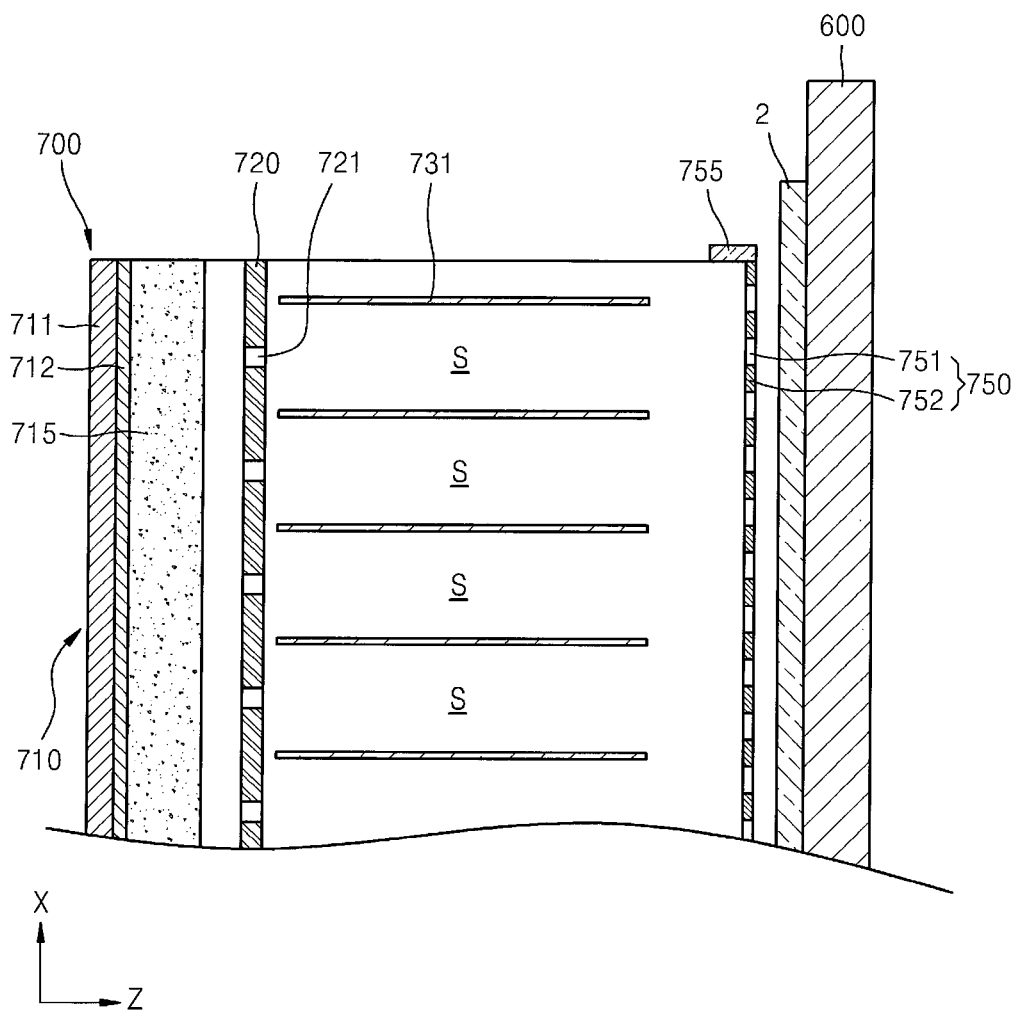
FIG. 9 is a schematic cross-sectional plan view of the organic layer deposition assembly of FIG. 7.

FIG. 7 is a schematic perspective view of an organic layer deposition assembly 700 according to another embodiment of the present invention. FIG. 8 is a schematic cross-sectional side view of the organic layer deposition assembly 700 of FIG. 7. FIG. 9 is a schematic cross-sectional plan view of the organic layer deposition assembly 700 of FIG. 7. For convenience of description, the present embodiment is described by primarily illustrating features different from those of the previous embodiment.

Referring to FIGS. 7 through 9, the organic layer deposition assembly 700 includes a deposition source 710, a deposition source nozzle unit 720, a shielding plate assembly (e.g., a barrier assembly) 730, and a patterning slit sheet 750.

The patterning slit sheet 750 is located between the deposition source 710 and a substrate 2. The patterning slit sheet 750 is combined with a frame 755 having a shape similar to a window frame. The patterning slit sheet 750 includes a plurality of patterning slits 751 arranged along an X-axis direction. An intermediate region 752 is formed between the adjacent patterning slits 751.

The patterning slit sheet 750 is substantially the same as the aforementioned patterning slit sheet 130 and thus detailed descriptions thereof are omitted here.

A deposition material 715 that has been vaporized in the deposition source 710 passes through the deposition source nozzle unit 720 and the patterning slit sheet 750 and then moves toward the substrate 2, which is a deposition target.

The deposition source 710 includes a crucible 711 that is filled with the deposition material 715 and a heater 712 that heats the crucible 711 so as to vaporize the deposition material 715 included in the crucible 711 toward the deposition source nozzle unit 720. The deposition source nozzle unit 720 is located at a side of the deposition source 710, and a plurality of deposition source nozzles 721 are formed on the deposition source nozzle unit 720 along the X-axis direction.

The shielding plate assembly 730 is arranged at a side of the deposition source nozzle unit 720. The shielding plate assembly 730 includes a plurality of shielding plates (e.g., barrier plates) 731 and a shielding plate frame 732 located at an outer side of the shielding plates 731. The shielding plates 731 may be arranged in parallel to each other along the X-axis direction. Here, the shielding plates 731 may be positioned at regular intervals. Also, each of the shielding plates 731 may extend along Y-Z planes and may have a rectangular shape. The shielding plates 731 that are arranged in the aforementioned manner define a space between the deposition source nozzle unit 720 and the patterning slit sheet 750 into a plurality of deposition spaces S, so that a deposition material that is exhausted from one deposition source nozzle 721 is not mixed with deposition materials that are exhausted from other deposition source nozzles 721, but passes through the patterning slit 751 and then is deposited onto the substrate 2. That is, each of the shielding plates 731 functions to guide a movement path of the deposition material, so that the deposition material exhausted from each of the deposition source nozzles 721 goes straight in a Z-axis direction without spreading.

As described above, a linearity of the deposition material is achieved by arrangement of the shielding plates 731, so that a size of shadows formed on the substrate 2 may be reduced (e.g., significantly reduced), and thus the organic layer deposition assembly 700 and the substrate 2 may be spaced apart from each other by a certain distance (e.g., a gap).

Also, a deposition process may proceed while the substrate 2 that is fixed onto an electrostatic chuck 600 moves with respect to the organic layer deposition assembly 700.

Although not illustrated, a plurality of the organic layer deposition assemblies 700 may be arranged, and a deposition process may proceed while the substrate 2 sequentially passes over the plurality of the organic layer deposition assemblies 700.

Figure 10:
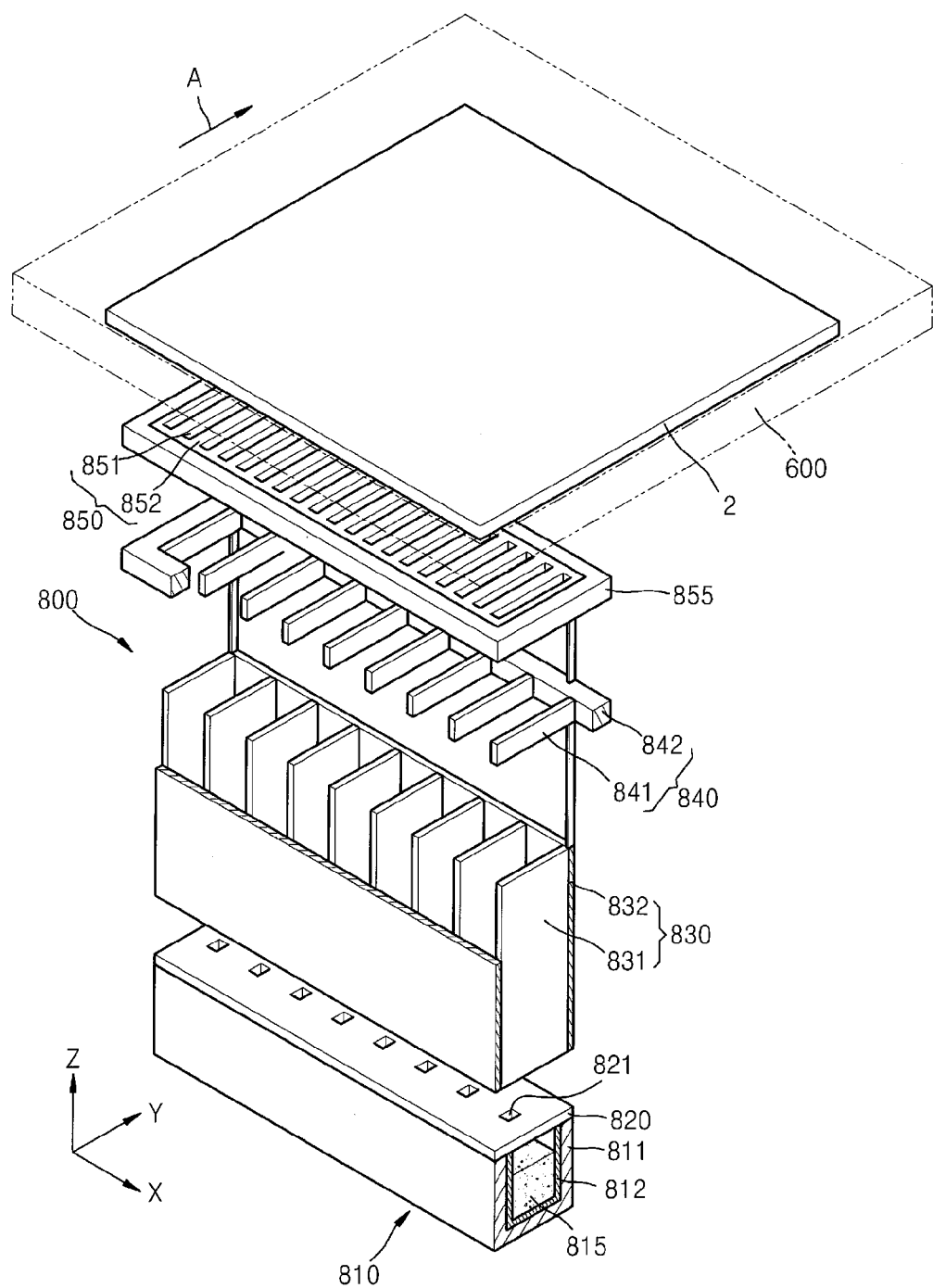
FIG. 10 is a schematic perspective view of an organic layer deposition assembly according to another embodiment of the present invention.

FIG. 10 is a schematic perspective view of an organic layer deposition assembly 800 according to another embodiment of the present invention. For convenience of description, the present embodiment is described by primarily illustrating features different from those of the previous embodiment.

Referring to FIG. 10, the organic layer deposition assembly 800 includes a deposition source 810, a deposition source nozzle unit 820, a first shielding plate assembly (e.g., a first barrier assembly) 830, a second shielding plate assembly (e.g., a second barrier assembly) 840, and a patterning slit sheet 850.

The patterning slit sheet 850 is located between the deposition source 810 and a substrate 2. The patterning slit sheet 850 is combined with a frame 855 having a shape similar to a window frame. The patterning slit sheet 850 includes a plurality of patterning slits 851 arranged along an X-axis direction. An intermediate region 852 is formed between the adjacent patterning slits 851.

The patterning slit sheet 850 is substantially the same as the aforementioned patterning slit sheet 130 and thus detailed descriptions thereof are omitted herein.

Also, features of the deposition source 810 and the first shielding plate assembly 830 are substantially the same as features of the previous embodiment of FIG. 7 and thus detailed descriptions thereof are omitted herein. The present embodiment is different from the previous embodiment of FIG. 7 in that the second shielding plate assembly 840 is arranged at a side of the first shielding plate assembly 830.

In more detail, the second shielding plate assembly 840 includes a plurality of second shielding plates (e.g., second barrier plates) 841 and a second shielding plate frame 842 located at an outer side of the second shielding plates 841. The second shielding plates (e.g., second barrier plates) 841 may be arranged in parallel with each other along the X-axis direction. Also, the second shielding plates 841 may be positioned at regular intervals. Also, each of the second shielding plates 841 may extend along Y-Z planes, i.e., may be perpendicular to the X-axis direction.

A plurality of first shielding plates 831 and the second shielding plates 841, which are arranged in the aforementioned manner, define a space between the deposition source nozzle unit 820 and the patterning slit sheet 850. That is, the present embodiment is characterized in that deposition spaces are defined respectively with respect to a plurality of deposition source nozzles 821 that spray deposition material, due to the first shielding plates 831 and the second shielding plates 841.

Here, the first shielding plates 831 and the second shielding plates 841 may be arranged to correspond to each other. In other words, the first shielding plates 831 may align with the second shielding plates 841, respectively, and thus may be in parallel with each other. That is, the first shielding plate 831 and the second shielding plate 841 that correspond to each other may be positioned on the same plane. Referring to FIG. 10, in one embodiment, a thickness of each first shielding plate 831 is substantially equal to an X-axis direction width of each second shielding plate 841 but aspects of the present invention are not limited thereto. That is, the second shielding plates 841 that are accurately aligned with the adjacent patterning slits 851 may be relatively thin, whereas the first shielding plates 831 that are not accurately aligned with the adjacent patterning slits 851 may be relatively thick for ease of manufacturing.

Also, a deposition process may proceed while the substrate 2 that is fixed onto an electrostatic chuck 600 moves with respect to the organic layer deposition assembly 800.

Although not illustrated, a plurality of the organic layer deposition assemblies 800 may be arranged, and a deposition process may proceed while the substrate 2 sequentially passes over the plurality of the organic layer deposition assemblies 800.

Figure 11:
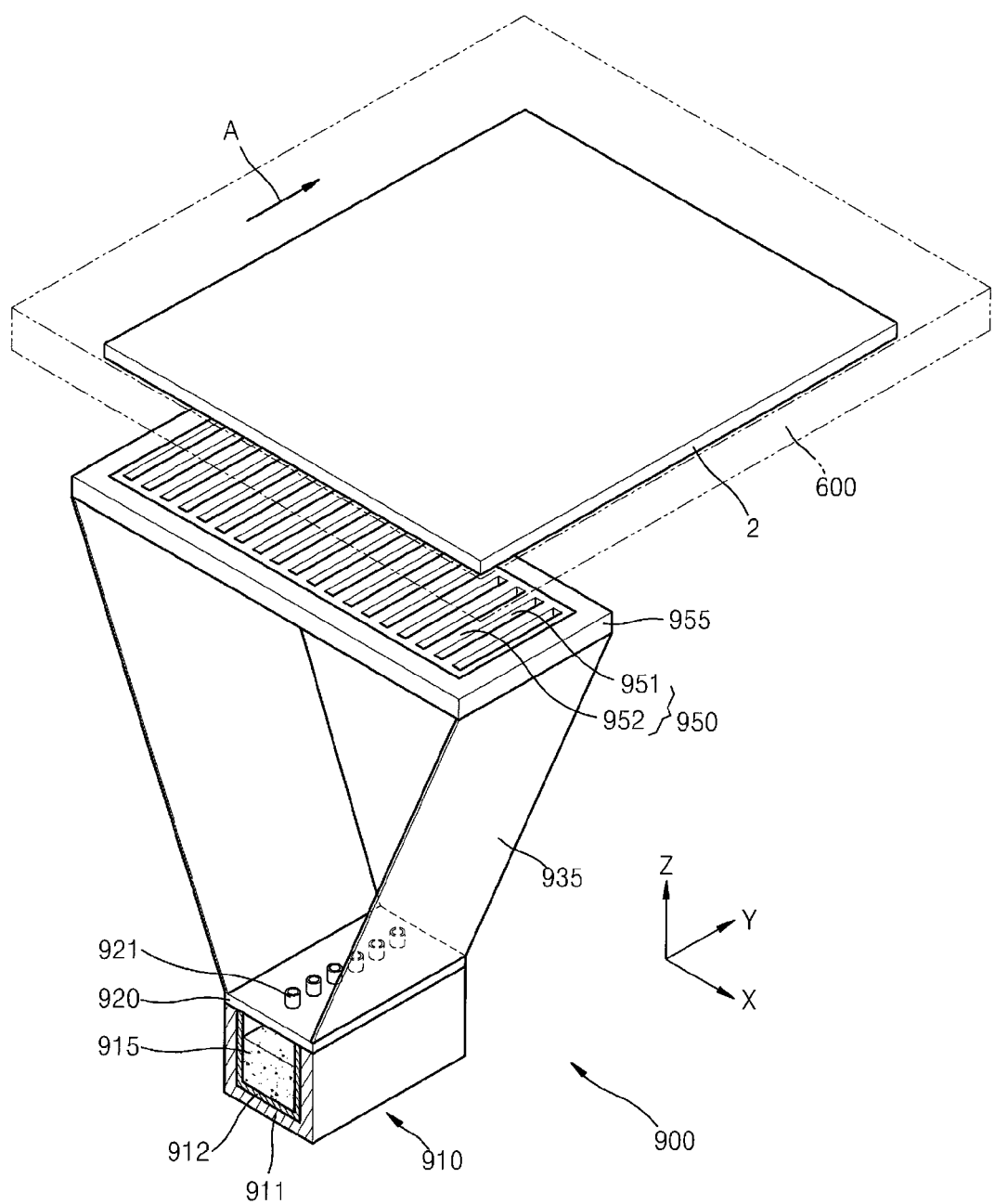
FIG. 11 is a schematic perspective view of an organic layer deposition assembly according to another embodiment of the present invention.

FIG. 11 is a schematic perspective view of an organic layer deposition assembly 900 according to another embodiment of the present invention. For convenience of description, the present embodiment is described by primarily illustrating features different from those of the previous embodiment.

Referring to FIG. 11, the organic layer deposition assembly 900 includes a deposition source 910, a deposition source nozzle unit 920, and a patterning slit sheet 950.

The patterning slit sheet 950 is located between the deposition source 910 and a substrate 2. The patterning slit sheet 950 is combined with a frame 955 having a shape similar to a window frame. The patterning slit sheet 950 includes a plurality of patterning slits 951 arranged along an X-axis direction. An intermediate region 952 is formed between the adjacent patterning slits 951.

The patterning slit sheet 950 is substantially the same as the aforementioned patterning slit sheet 130 and thus detailed descriptions thereof are omitted herein.

The deposition source 910 includes a crucible 911 that is filled with a deposition material 915 and a heater 912 that heats the crucible 911 so as to vaporize a deposition material 915 included in the crucible 911 toward the deposition source nozzle unit 920. The deposition source nozzle unit 920 is located at a side of the deposition source 910, and a plurality of deposition source nozzles 921 are formed on the deposition source nozzle unit 920 along a Y-axis direction.

The deposition source 910, the deposition source nozzle unit 920, and the patterning slit sheet 950 are combined by using connection members 935.

A plurality of deposition source nozzles 921 are formed on the deposition source nozzle unit 920 along the Y-axis direction, i.e., a scanning direction of the substrate 2. Here, the deposition source nozzles 921 may be arranged at regular intervals. The deposition material 915 that has been vaporized in the deposition source 910 passes through the deposition source nozzle unit 920 and then moves toward the substrate 2 that is a deposition target. As a result, in the organic layer deposition assembly 900, the deposition source nozzles 921 are formed along the scanning direction of the substrate 2. In this regard, only one deposition source nozzle 921 is formed in the X-axis direction, and thus the occurrence of shadows may be reduced (e.g., significantly reduced). Also, because the deposition source nozzles 921 are formed along the scanning direction of the substrate 2, a difference in flux occurring between the deposition source nozzles 121 may be compensated for and deposition uniformity may be maintained constant or substantially constant.

Also, a deposition process may proceed while the substrate 2 that is fixed onto an electrostatic chuck 600 moves with respect to the organic layer deposition assembly 900.

Although not illustrated, a plurality of the organic layer deposition assemblies 900 may be arranged, and a deposition process may proceed while the substrate 2 sequentially passes over the plurality of the organic layer deposition assemblies 900.

Figure 12:
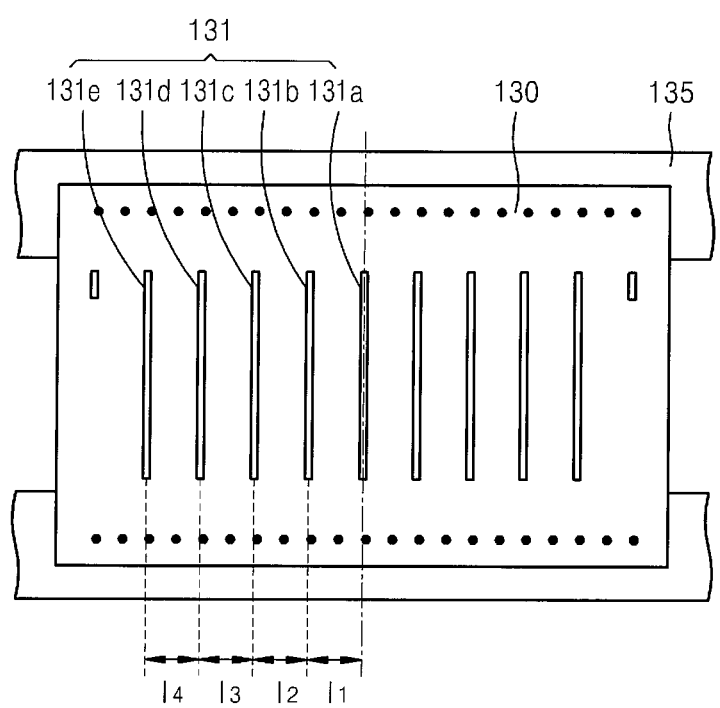
FIG. 12 is a schematic diagram illustrating a patterning slit sheet of the organic layer deposition apparatus of FIG. 1 in which patterning slits are arranged at equal intervals.
Figure 13:
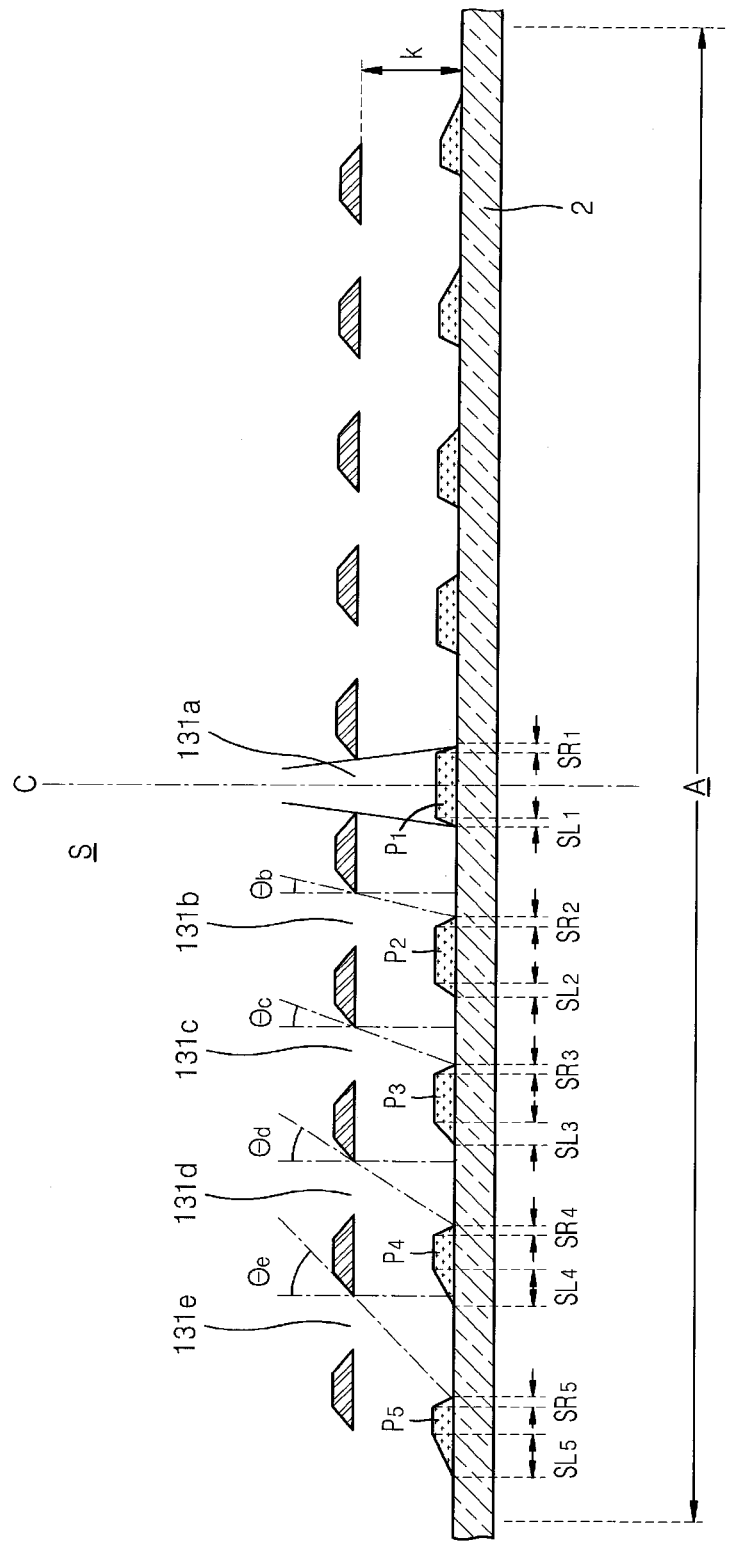
FIG. 13 is a schematic diagram illustrating organic layers formed on a substrate by using the patterning slit sheet of FIG. 12, according to an embodiment of the present invention.

FIG. 12 is a schematic diagram illustrating the patterning slit sheet 130 of the organic layer deposition apparatus 1 of FIG. 1 in which the patterning slits 131 are arranged at equal intervals. FIG. 13 is a schematic diagram illustrating organic layers formed on a substrate by using the patterning slit sheet 130 of FIG. 12, according to an embodiment of the present invention.

FIGS. 12 and 13 schematically illustrate the patterning slit sheet 130 in which the patterning slits 131 are arranged at equal intervals. That is, in FIG. 11, the patterning slits 131 satisfy the following condition: $I_1=I_2=I_3=I_4$.

In this embodiment, an incident angle of a deposition material discharged along a center line C of a deposition space S is substantially perpendicular to the substrate 2. Thus, an organic layer P1 formed using the deposition material that has passed through a patterning slit 131a has a minimum (or reduced) size of a shadow, and a right-side shadow $SR_1$ and a left-side shadow $SL_1$ are formed symmetrical to each other. Here, the deposition space S indicates a space in which a deposition pattern is formed on the substrate 2 by using the patterning slits 131 and not a space in which a pattern deposited by using an alignment confirmation pattern slit 135 is formed.

However, a critical incident angle θ of the deposition material that passes through patterning slits disposed farther from the center line C of the deposition space S gradually increases, and thus, in one embodiment, the critical incident angle θ of the deposition material that passes through the outermost patterning slit 131e is approximately 55°. Accordingly, the deposition material is incident at an inclination with respect to the patterning slit 131e, and an organic layer $P_5$ formed using the deposition material that has passed through the patterning slit 131e has the largest shadow. For example, a left-side shadow $SL_5$ is larger than a right-side shadow $SR_5$.

That is, as the critical incident angle θ of the deposition material increases, the size of the shadow also increases. For example, the size of the shadow at a position farther from the center line C of the deposition space S increases. In addition, the critical incident angle θ of the deposition material increases as a distance between the center line C of the deposition space S and the respective patterning slits increases. Thus, organic layers formed using the deposition material that passes through the patterning slits disposed farther from the center line C of the deposition space S have a relatively larger shadow size. For example, of the shadows on both sides of the respective organic layers, the size of the shadow at a position farther from the center line C of the deposition space S is larger than that of the other.

That is, referring to FIG. 13, the organic layers formed on the left side of the center line C of the deposition space S have a structure in which a left hypotenuse (a slanted side on the left between top and bottom sides) is larger than a right hypotenuse (a slanted side on the right between the top and bottom sides), and the organic layers formed on the right side of the center line C of the deposition space S have a structure in which a right hypotenuse (e.g., a right slanted side) is larger than a left hypotenuse (e.g., a left slanted side).

Also, in the organic layers formed on the left side of the center line C of the deposition space S, the length of the left hypotenuse (e.g., a left slanted side) of the organic layers located farther from the center line C increases towards the left. In the organic layers formed on the right side of the center line C of the deposition space S, the length of the right hypotenuse (e.g., a right slanted side) of the organic layers located farther from the center line C increases towards the right. Consequently, the organic layers formed in the deposition space S may be formed symmetrical to each other about the center line C of the deposition space S.

In other words, the critical incident angles satisfy the following condition: $\theta_b < \theta_c < \theta_d < \theta_e$, and thus, the sizes of the shadows of the organic layers also satisfy the following condition: $SL_1 < SL_2 < SL_3 < SL_4 < SL_5$.

Figure 14:
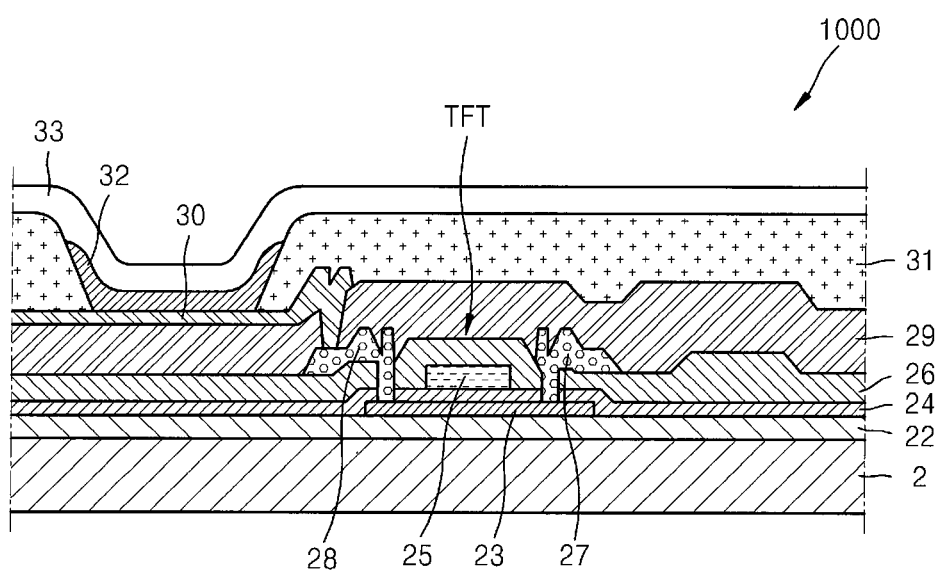
FIG. 14 is a schematic cross-sectional view of an organic light-emitting display apparatus manufactured by using the organic layer deposition apparatus, according to an embodiment of the present invention.

FIG. 14 is a schematic cross-sectional view of an organic light-emitting display apparatus 1000 manufactured by using the organic layer deposition apparatus 1, according to an embodiment of the present invention.

Hereinafter, the organic light-emitting display apparatus 1000 is described in detail.

A buffer layer 22 is formed on a substrate 2. The substrate 2 may be formed by using a glass material, a flexible plastic material, or any other suitable material. The buffer layer 22 prevents (or substantially prevents) penetration of foreign substances into the substrate 2, and provides a planar surface on the substrate 2. The buffer layer 22 may be formed of various suitable materials capable of performing the aforementioned functions. However, the buffer layer 22 is not an essential element and thus may be omitted.

An active layer 23 having a pattern (e.g., a predetermined pattern) is formed on the buffer layer 22. The active layer 23 may be formed of an inorganic semiconductor, such as amorphous silicon or polysilicon, or an organic semiconductor. The active layer 23 may include a source region, a drain region, and a channel region. The source region and the drain region of the active layer 23 may be formed by doping amorphous silicon or polysilicon with Group III impurities or Group V impurities.

A gate insulating layer 24 is formed on the active layer 23, and a gate electrode 25 is formed at a region (e.g., on a predetermined region) on the gate insulating layer 24. The gate insulating layer 24 that insulates the active layer 23 from the gate electrode 25, may be formed of an organic material or an inorganic material, such as SiNx or SiO2.

The gate electrode 25 may be formed of a metal selected from the group consisting of Au, Ag, Cu, Ni, Pt, Pd, Al, and Mo, or may be formed of a metal alloy, such as Al—Nd alloy, Mo—W alloy, or the like. However, the gate electrode 25 is not limited thereto, and may be formed by using various suitable materials in consideration of adhesion, planarization, electrical resistance, formability, and/or the like with respect to adjacent layers.

An interlayer insulating layer 26 is formed on the gate electrode 25. The interlayer insulating layer 26 and the gate insulating layer 24 may expose the source region and the drain region of the active layer 23, and a source electrode 27 and a drain electrode 28 are formed to respectively contact the exposed source and drain regions of the active layer 23.

The source electrode 27 and the drain electrode 28 may be formed by using various suitable conductive materials and may have a single-layered structure or a multi-layered structure.

A passivation layer 29 is formed on a thin-film transistor (TFT). For example, the passivation layer 29 is formed on the source electrode 27 and the drain electrode 28.

The passivation layer 29 does not cover an entire region of the drain electrode 28 but exposes a region (e.g., a predetermined region) of the drain electrode 28, and then a first electrode 30 is coupled (e.g., electrically coupled or connected) to the exposed region of the drain electrode 28.

A pixel-defining layer (PDL) 31 is formed on the first electrode 30. The PDL 31 exposes a region (e.g., a predetermined region) of the first electrode 30, and an intermediate layer 32, including an organic EML that contacts the exposed region of the first electrode 30, is formed. Afterwards, a second electrode 33 is formed to be coupled (e.g., contacted, electrically coupled or connected) to the intermediate layer 32.

The intermediate layer 32, including the organic EML, may be formed as a small-molecule organic layer or a polymer organic layer. When the organic EML includes a small-molecule organic layer, a hole injection layer (HIL), a hole transport layer (HTL), an electron transport layer (ETL), an electron injection layer (EIL), or the like may be singularly or multiply stacked with the organic EML.

Here, the intermediate layer 32, including the organic EML, may be deposited by using the organic layer deposition apparatus 1 or any other suitable organic layer deposition apparatus according to embodiments of the present invention.

That is, after the first electrode 30 and the PDL 31 are formed on the substrate 2, the intermediate layer 32 may be formed by using the organic layer deposition apparatus 1 or any other suitable organic layer deposition apparatus according to embodiments of the present invention.

For example, in a case where the organic layer deposition apparatus 1 of FIG. 1 is used, a red organic EML, a green organic EML, a blue organic EML, and an auxiliary EML may be sequentially deposited onto the first electrode 30 on the substrate 2 by respectively using the organic layer deposition assemblies 100-1, 100-2, 100-3, and 100-4.

The first electrode 30 may include indium tin oxide (ITO), indium zinc oxide (IZO), zinc oxide (ZnO), or indium oxide ($In_2O_3$). Alternatively, the first electrode 30 may include silver (Ag), magnesium (Mg), aluminum (Al), platinum (Pt), palladium (Pd), gold (Au), nickel (Ni), neodymium (Nd), iridium (Ir), chromium (Cr), or a compound thereof.

A second electrode 33 may include lithium (Li), calcium (Ca), lithium fluoride/calcium (LiF/Ca), lithium fluoride/aluminum (LiF/Al), aluminum (Al), silver (Ag), magnesium (Mg), or a compound thereof. Alternatively, the second electrode 62 may include ITO, IZO, ZnO, $In_2O_3$, or the like.

An encapsulation member (not shown) may be located on the second electrode 33. The encapsulation member may function to protect the intermediate layer 32 and other layers against external moisture or oxygen. The encapsulation member may be formed of a plastic material or may have a structure in which an organic material and an inorganic material are stacked.

An organic layer deposition apparatus, an organic light-emitting display apparatus and a method of manufacturing the organic light-emitting display apparatus, according to the one or more embodiments of the present invention, may easily improve a characteristic of a deposited layer.

While the present invention has been particularly shown and described with reference to exemplary embodiments thereof, it will be understood by those of ordinary skill in the art that various changes in form and details may be made therein without departing from the spirit and scope of the present invention as defined by the following claims and equivalents.

What is claimed is:

1. A method of manufacturing an organic light-emitting display apparatus by using an organic layer deposition apparatus, the method comprising:

attaching a substrate to a transfer unit in a loading unit;

transporting the transfer unit into a chamber by using a first conveyer unit comprising a guide member having accommodation grooves to accommodate both sides of the transfer unit so as to guide a first direction movement of the transfer unit to which the substrate is attached, wherein the guide member comprises a first accommodation part, a second accommodation part, and a connection part, and passes through the chamber;

forming an organic layer by depositing a deposition material discharged from an organic layer deposition assembly on the substrate while the substrate is moved relative to the organic layer deposition assembly in the chamber at a space from the substrate;

separating the substrate on which the depositing has been completed from the transfer unit in an unloading unit; and transporting the transfer unit from which the substrate is separated to the loading unit by using a second conveyer unit that passes through the chamber, wherein the first accommodation part of the guide member is located closer to ground than the second accommodation part, and comprises a lower member, an upper member, and elastic members between the lower member and the upper member.

2. The method of claim 1, wherein the organic layer deposition assembly comprises a plurality of organic layer deposition assemblies, and wherein deposition is sequentially performed on the substrate by using the plurality of organic layer deposition assemblies.

3. The method of claim 1, wherein the transfer unit is cyclically moved between the first conveyer unit and the second conveyer unit.

4. The method of claim 1, wherein the transfer unit is transferred in the chamber in non-contact with the first conveyer unit.

5. The method of claim 1, wherein the organic layer deposition assembly comprises a plurality of organic layer deposition assemblies for discharging different deposition materials.

* * * * *